(12) United States Patent
Shih

(10) Patent No.: US 12,578,870 B2
(45) Date of Patent: Mar. 17, 2026

(54) INTERFACE CIRCUIT AND MEMORY CONTROLLER

(71) Applicant: Silicon Motion, Inc., Hsinchu County (TW)

(72) Inventor: Fu-Jen Shih, New Taipei City (TW)

(73) Assignee: Silicon Motion, Inc., Hsinchu County (TW)

( * ) Notice: Subject to any disclaimer, the term of this patent is extended or adjusted under 35 U.S.C. 154(b) by 519 days.

(21) Appl. No.: 18/215,183

(22) Filed: Jun. 28, 2023

(65) Prior Publication Data

US 2024/0241647 A1     Jul. 18, 2024

(30) Foreign Application Priority Data

Jan. 17, 2023     (TW) ................................. 112102099

(51) Int. Cl.
*G06F 3/06*         (2006.01)
*G11C 7/10*         (2006.01)
(Continued)

(52) U.S. Cl.
CPC .......... *G06F 3/0619* (2013.01); *G06F 3/0653* (2013.01); *G06F 3/0679* (2013.01); (Continued)

(58) Field of Classification Search
CPC .... G06F 3/0619; G06F 3/0653; G06F 3/0679; G11C 7/1048; G11C 7/24; G11C 29/023; (Continued)

(56) References Cited

U.S. PATENT DOCUMENTS

| | | | |
|---|---|---|---|
| 5,973,643 A | 10/1999 | Hawkes | |
| 7,027,981 B2 | 4/2006 | Bizjak | |

(Continued)

FOREIGN PATENT DOCUMENTS

| | | | | |
|---|---|---|---|---|
| CN | 101494443 A | 7/2009 | | |
| CN | 113225279 A | * 8/2021 | ............. | H04B 17/21 |

(Continued)

OTHER PUBLICATIONS

Shih, the specification, including the claims, and drawings in the U.S. Appl. No. 18/213,907 , filed Jun. 26, 2023.

(Continued)

*Primary Examiner* — Eric Nowlin
(74) *Attorney, Agent, or Firm* — Winston Hsu

(57) ABSTRACT

An interface circuit includes multiple signal processing devices and a monitor and calibration module including multiple monitoring circuits, multiple calibration circuits and a compensation control mechanism operation logic. The monitoring circuits monitor a reception signal, a transmission signal, a power supplying voltage and a ground voltage to correspondingly generate monitored results. The calibration circuits perform a calibration operation on at least one signal processing device to adjust a characteristic value of the signal processing device. The compensation control mechanism operation logic generates a calibration control signal to control the calibration operation of the calibration circuits based on the monitored results. The compensation control mechanism operation logic is implemented by FPGA and includes a calibration handle interface which generates the calibration control signal according to a decoding result of a calibration command and transmits the calibration control signal to one of the calibration circuits.

14 Claims, 8 Drawing Sheets

(51) Int. Cl.
    *G11C 29/02*         (2006.01)
    *G11C 29/28*         (2006.01)
    *G11C 29/42*         (2006.01)

(52) U.S. Cl.
    CPC .......... *G11C 7/1048* (2013.01); *G11C 29/023*
    (2013.01); *G11C 29/28* (2013.01); *G11C 29/42*
    (2013.01); *G11C 2207/2254* (2013.01)

(58) Field of Classification Search
    CPC ....... G11C 29/028; G11C 29/28; G11C 29/42;
                    G11C 2207/2254; G11C 2029/0411;
                    H03K 19/00369; H03K 19/017509;
                                  H03M 9/00
    See application file for complete search history.

(56)               References Cited

U.S. PATENT DOCUMENTS

| | | | |
|---|---|---|---|
| 7,159,136 B2 | 1/2007 | Best | |
| 7,203,460 B2 * | 4/2007 | Boose | G01R 31/31716 |
| | | | 455/66.1 |
| 7,741,873 B2 * | 6/2010 | Hollis | H03K 19/018571 |
| | | | 326/83 |
| 7,940,667 B1 * | 5/2011 | Coady | H04W 56/00 |
| | | | 342/72 |
| 8,358,151 B2 * | 1/2013 | Hollis | H03K 19/018585 |
| | | | 326/83 |
| 9,288,019 B2 * | 3/2016 | Cowley | H03K 5/13 |
| 9,405,678 B2 | 8/2016 | Zerbe | |
| 9,613,665 B2 | 4/2017 | Chen | |
| 10,129,121 B2 * | 11/2018 | Kwan | H04L 43/087 |
| 10,522,203 B2 | 12/2019 | Jung | |
| 11,316,551 B2 * | 4/2022 | Wang | H04B 1/525 |
| 11,574,673 B2 | 2/2023 | Jung | |
| 11,581,958 B2 * | 2/2023 | Jayasimha | H04B 17/0085 |
| 11,689,395 B2 * | 6/2023 | Valliappan | H04L 25/03267 |
| | | | 375/232 |
| 11,901,961 B2 * | 2/2024 | Shih | H04B 17/11 |
| 12,009,675 B2 * | 6/2024 | Lyu | A61N 1/3787 |
| 12,026,041 B2 * | 7/2024 | Shih | G06F 11/0751 |
| 12,267,116 B2 * | 4/2025 | Jayasimha | H04L 27/2613 |
| 2004/0243899 A1 * | 12/2004 | Bonneau | G01R 31/31725 |
| | | | 714/733 |
| 2005/0079822 A1 * | 4/2005 | Boose | G01R 31/31716 |
| | | | 455/67.11 |
| 2006/0098699 A1 | 5/2006 | Sanchez | |
| 2006/0136763 A1 | 6/2006 | Jorgenson | |
| 2007/0088998 A1 * | 4/2007 | Bonneau | H04L 1/243 |
| | | | 714/724 |
| 2009/0261859 A1 * | 10/2009 | Hollis | H03K 19/00315 |
| | | | 326/63 |
| 2010/0127739 A1 | 5/2010 | Ebuchi | |
| 2010/0195778 A1 | 8/2010 | Adams | |
| 2010/0220828 A1 | 9/2010 | Fuller | |
| 2010/0231233 A1 | 9/2010 | Dasnurkar | |

| | | | |
|---|---|---|---|
| 2010/0231260 A1 * | 9/2010 | Hollis | H03K 19/018585 |
| | | | 326/83 |
| 2011/0193639 A1 * | 8/2011 | Liu | G06F 1/08 |
| | | | 331/1 A |
| 2011/0268232 A1 | 11/2011 | Park | |
| 2013/0007333 A1 | 1/2013 | Fai | |
| 2014/0237302 A1 | 8/2014 | Berry, Jr. | |
| 2015/0332735 A1 | 11/2015 | Chun | |
| 2016/0006544 A1 * | 1/2016 | Cowley | H03K 5/13 |
| | | | 327/20 |
| 2016/0091941 A1 | 3/2016 | C.R | |
| 2018/0095916 A1 | 4/2018 | Zerbe | |
| 2018/0173666 A1 | 6/2018 | Srivastava | |
| 2018/0254964 A1 * | 9/2018 | Kwan | H04L 43/087 |
| 2019/0107862 A1 | 4/2019 | Chang | |
| 2019/0171381 A1 | 6/2019 | Ioannou | |
| 2019/0288700 A1 | 9/2019 | Yu | |
| 2020/0127699 A1 * | 4/2020 | Wang | H04B 1/44 |
| 2020/0244383 A1 | 7/2020 | He | |
| 2020/0293080 A1 | 9/2020 | Poon | |
| 2021/0203334 A1 * | 7/2021 | Yu | H03L 7/107 |
| 2021/0271615 A1 | 9/2021 | Yamamoto | |
| 2022/0244336 A1 | 8/2022 | Mishra | |
| 2022/0303028 A1 * | 9/2022 | Jayasimha | H04B 17/0085 |
| 2023/0168958 A1 * | 6/2023 | Shih | G06F 11/0745 |
| 2023/0171005 A1 * | 6/2023 | Shih | H04B 17/11 |
| | | | 375/222 |
| 2023/0216347 A1 * | 7/2023 | Lyu | A61N 1/3787 |
| | | | 307/104 |
| 2023/0239060 A1 * | 7/2023 | Jayasimha | H04L 27/2626 |
| 2024/0106490 A1 * | 3/2024 | Mishra | H04B 1/30 |
| 2024/0241786 A1 | 7/2024 | Shih | |
| 2024/0241787 A1 | 7/2024 | Shih | |
| 2024/0361919 A1 | 10/2024 | Shih | |
| 2024/0363183 A1 | 10/2024 | Shih | |

FOREIGN PATENT DOCUMENTS

| | | | | |
|---|---|---|---|---|
| CN | 113225279 B | * | 11/2023 | H04B 17/21 |
| TW | 200849273 | | 12/2008 | |
| TW | 201346529 A | | 11/2013 | |
| TW | 201436617 A | | 9/2014 | |
| TW | 201603497 A | | 1/2016 | |
| TW | 202042512 A | | 11/2020 | |
| TW | 202125981 A | | 7/2021 | |
| TW | 202139187 A | | 10/2021 | |
| TW | 202205811 A | | 2/2022 | |

OTHER PUBLICATIONS

Shih, the specification, including the claims, and drawings in the U.S. Appl. No. 18/215,181 , filed Jun. 28, 2023.
Shih, the specification, including the claims, and drawings in the U.S. Appl. No. 18/215,796 , filed Jun. 28, 2023.
Stephen Sunter et al., "An automated, complete, structural test solution for SERDES," 2004 IEEE, International Test Conference, Paper 4.3, pp. 95-104, 2004.

\* cited by examiner

INTERFACE CIRCUIT AND MEMORY CONTROLLER

BACKGROUND OF THE INVENTION

1. Field of the Invention

The invention relates to an interface circuit and a memory controller implementing a method for monitoring and calibrating signal processing devices in the interface circuit, more particularly to a method, suitable for the interface circuit that provides high-speed data transmission, which utilizes a monitor and calibration module to actively monitor the signal processing devices in the interface circuit and calibrate the signal processing devices based on a compensation control mechanism, so as to compensate for drift in current, voltage and/or frequency in real-time and to avoid fatal error.

2. Description of the Prior Art

Serializer-Deserializer (SerDes) is a pair of function blocks commonly used in high-speed communication to compensate for limited input/output. SerDes is configured to convert data between serial data and parallel interfaces in either direction. The primary purpose of a SerDes is to provide data transfer over a single line or a differential pair to minimize the number of input/output pins and interconnects.

SerDes operates at high frequency. However, high frequency signal transmission has low tolerance to frequency or voltage jitter. In addition, the use of advanced process technology also easily leads to some problems such as frequency and voltage jitter or drift in the serializer-deserializer. If the characteristic values of the signal processing devices in the SerDes drift, the frequency or voltage jitter caused by the drift may cause fatal errors to the signal processing in SerDes. Once a fatal error occurs, the system must be powered off or reset, causing a lot of inconvenience.

To avoid fatal errors to occur in high-speed communication systems, a method for efficiently and real-time calibrating characteristic values of the signal processing devices inside the SerDes is required, so as to compensate for the drift in current, voltage and/or frequency.

SUMMARY OF THE INVENTION

According to an embodiment of the invention, an interface circuit comprises a signal processing circuit configured to process a reception signal received from a host device and a transmission signal to be transmitted to the host device. The signal processing circuit comprises a plurality of signal processing devices and a monitor and calibration module. The monitor and calibration module comprises a plurality of monitor circuits, a plurality of calibration circuits and a compensation control mechanism operation logic. The monitor circuits are configured to monitor at least one of an amplitude, a frequency and a jitter in at least one of the reception signal and the transmission signal to generate a monitored result corresponding to the at least one of the amplitude, the frequency and the jitter in the at least one of the reception signal and the transmission signal and to monitor at least one of a power supplying voltage and a ground voltage to generate a monitored result corresponding to the at least one of the power supplying voltage and the ground voltage in a monitor and calibration procedure. The calibration circuits are coupled to the signal processing devices and respectively configured to perform a calibration operation on at least one of the signal processing devices in the monitor and calibration procedure to adjust a characteristic value of the at least one of the signal processing devices. The compensation control mechanism operation logic is coupled to the monitor circuits and the calibration circuits and configured to collect the monitored results from the monitor circuits and sequentially generate a calibration control signal corresponding to each calibration circuit based on the monitored results to respectively control the corresponding calibration circuit to perform the calibration operation on the at least one of the signal processing devices in response to the calibration control signal. The compensation control mechanism operation logic is implemented by a Field Programmable Gate Array (FPGA) and comprises a calibration handle interface coupled to the calibration circuits and configured to receive and decode a calibration command and generate the calibration control signal according to a decoding result of the calibration command, and transmit the calibration control signal to at least one of the calibration circuits.

According to an embodiment of the invention, a memory controller coupled to a memory device to control access operations of the memory device and comprises a host interface configured to communicate with a host device and comprising a signal processing circuit to process a reception signal received from the host device and a transmission signal to be transmitted to the host device. The signal processing circuit comprises a plurality of signal processing devices and a monitor and calibration module. The monitor and calibration module comprises a plurality of monitor circuits, a plurality of calibration circuits and a compensation control mechanism operation logic. The monitor circuits are configured to monitor at least one of an amplitude, a frequency and a jitter in at least one of the reception signal and the transmission signal to generate a monitored result corresponding to the at least one of the amplitude, the frequency and the jitter in the at least one of the reception signal and the transmission signal and to monitor at least one of a power supplying voltage and a ground voltage to generate a monitored result corresponding to the at least one of the power supplying voltage and the ground voltage in a monitor and calibration procedure. The calibration circuits are coupled to the signal processing devices and respectively configured to perform a calibration operation on at least one of the signal processing devices in the monitor and calibration procedure to adjust a characteristic value of the at least one of the signal processing devices. The compensation control mechanism operation logic is coupled to the monitor circuits and the calibration circuits and configured to collect the monitored results from the monitor circuits and sequentially generate a calibration control signal corresponding to each calibration circuit based on the monitored results to respectively control the corresponding calibration circuit to perform the calibration operation on the at least one of the signal processing devices in response to the calibration control signal. The compensation control mechanism operation logic is implemented by a Field Programmable Gate Array (FPGA) and comprises a calibration handle interface coupled to the calibration circuits and configured to receive and decode a calibration command and generate the calibration control signal according to a decoding result of the calibration command, and transmit the calibration control signal to at least one of the calibration circuits.

These and other objectives of the present invention will no doubt become obvious to those of ordinary skill in the art after reading the following detailed description of the preferred embodiment that is illustrated in the various figures and drawings.

DETAILED DESCRIPTION

In the following, numerous specific details are described to provide a thorough understanding of embodiments of the invention. However, one of skilled in the art will understand how to implement the invention in the absence of one or more specific details, or relying on other methods, elements or materials. In other instances, well-known structures, materials or operations are not shown or described in detail in order to avoid obscuring the main concepts of the invention.

Reference throughout this specification to "one embodiment", "an embodiment", "one example" or "an example" means that a particular feature, structure or characteristic described in connection with the embodiment or example is included in at least one embodiment of a plurality of embodiments. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples.

In addition, in order to make the objects, features and advantages of the invention more comprehensible, specific embodiments of the invention are set forth in the accompanying drawings. This description is made for the purpose of illustrating the general principles of the invention and should not be taken in a limiting sense. It should be understood that the following embodiments can be implemented by software, hardware, firmware, or any combination thereof.

Figure 1:
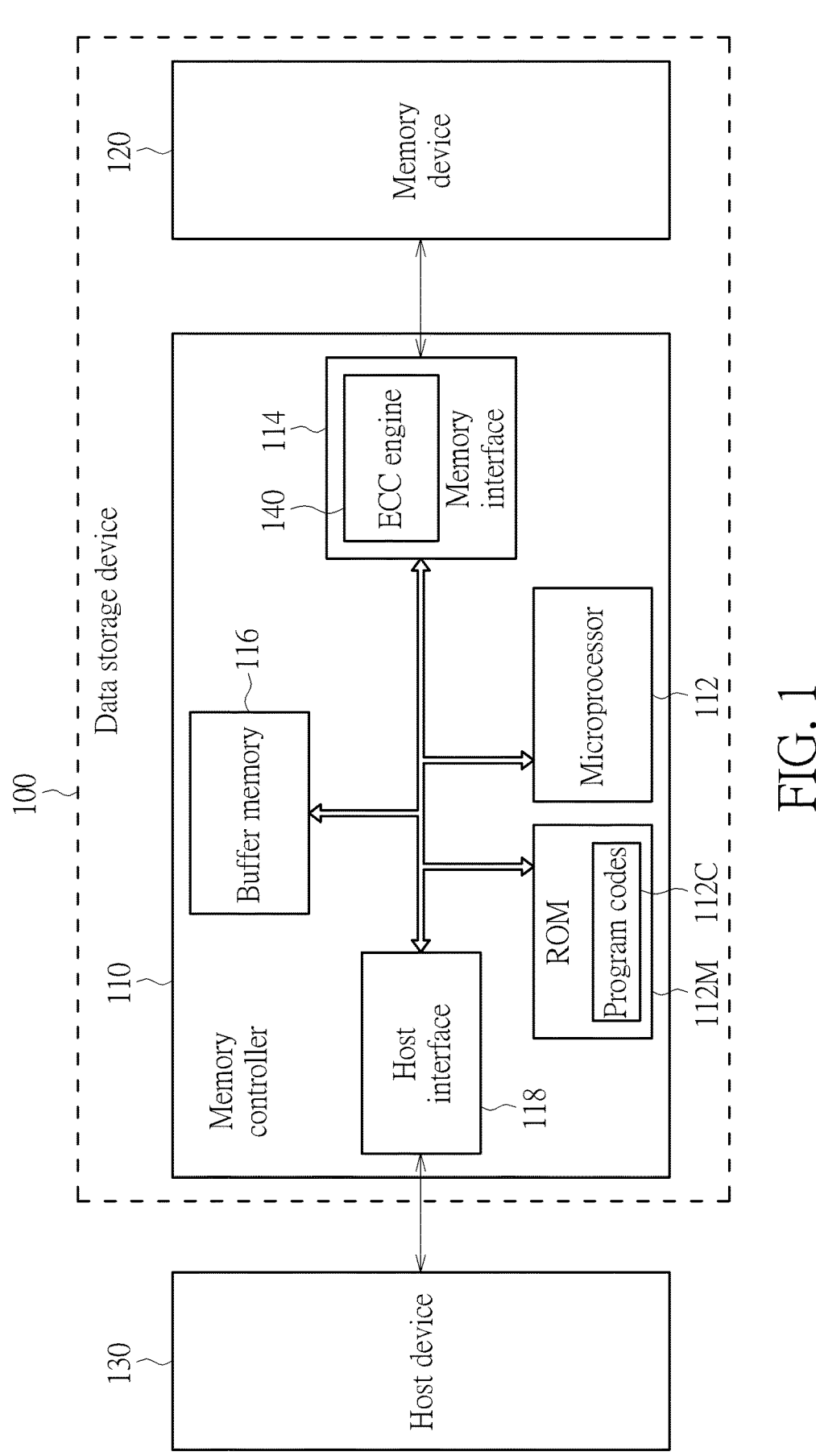
FIG. 1 is an exemplary block diagram of a data storage device according to an embodiment of the invention.

FIG. 1 is an exemplary block diagram of a data storage device according to an embodiment of the invention. The data storage device 100 may comprise a memory device 120 and a memory controller 110. The memory controller 110 is configured to access the memory device 120 and control operations of the memory device 120. The memory device 120 may be a non-volatile (NV) memory (e.g. a Flash memory) device and may comprise one or more memory elements (e.g. one or more Flash memory dies, or one or more Flash memory chip, or the likes).

The data storage device 100 may be coupled to a host device 130. The host device 130 may comprise at least one processor, a power supply circuit, and at least one random access memory (RAM), such as at least one dynamic RAM (DRAM), at least one static RAM (SRAM), . . . etc. (not shown in FIG. 1). The processor and the RAM may be coupled to each other through a bus, and may be coupled to the power supply circuit to obtain power. The processor may be arranged to control operations of the host device 130, and the power supply circuit may be arranged to provide the processor, the RAM, and the data storage device 100 with power. For example, the power supply circuit may output one or more driving voltages to the data storage device 100. The data storage device 100 may obtain the one or more driving voltages from the host device 130 as the power of the data storage device 100 and provide the host device 130 with storage space.

According to an embodiment of the invention, the host device 130 may issue commands, such as the read command or the write command, to the data storage device 100, so as to access the data stored in the memory device 120, or the host device 130 may issue commands to further control or manage the data storage device 100.

According to an embodiment of the invention, the memory controller 110 may comprise a microprocessor 112, a Read Only Memory (ROM) 112M, a memory interface 114, a buffer memory 116 and a host interface 118. The ROM 112M is configured to store program codes 112C. The microprocessor 112 is configured to execute the program codes 112C, thereby controlling access to the memory device 120. The program codes 112C may comprise one or more program modules, such as the boot loader code. When the data storage device 100 obtains power from the host device 130, the microprocessor 112 may perform an initialization procedure of the data storage device 100 by executing the program codes 112C. In the initialization procedure, the microprocessor 112 may load a group of In-System Programming (ISP) codes (not shown in FIG. 1) from the memory device 120. The microprocessor 112 may execute the group of ISP codes, so that the data storage device 100 has various functions. According to an embodiment of the invention, the group of ISP codes may comprise, but are not limited to: one or more program modules related to memory access (e.g. read, write and erase), such as a read operation module, a table lookup module, a wear leveling module, a read refresh module, a read reclaim module, a garbage collection module, a sudden power off recovery (SPOR) module and an uncorrectable error correction code (UECC) module, respectively provided for performing the operations of read, table lookup, wear leveling, read refresh, read reclaim, garbage collection, SPOR and error handling for detected UECC error.

The memory interface 114 may comprise an error correction code (ECC) engine 140. The ECC engine 140 may comprise a data buffer (not shown in FIG. 1) for buffering data to assist the ECC engine 140 in performing the encoding and decoding on the data. In the write procedure to write data into the memory device 120, the ECC engine 140 is configured to encode the data to be written into the memory device 120, such as performing the ECC encoding, so as to generate extra parity bits. In the read procedure to read data from the memory device 120, the ECC engine 140 is configured to decode the data read from the memory device 120 to detect the error bit(s) in the data and correct the value(s) of the error bit(s) when the error is correctable (e.g., the number of error bits does not exceed the maximum number of error bits that can be corrected by the ECC engine 140).

Typically, the memory device 120 may comprise a plurality of memory elements, such as a plurality of Flash memory dies or Flash memory chips, and each memory element may comprise a plurality of memory blocks. The access unit of an erase operation performed by the memory controller 110 on the memory device 120 may be one memory block. In addition, a memory block may record (comprise) a predetermined number of pages, for example, the physical pages, and the access unit of a write operation performed by the memory controller 110 on the memory device 120 may be one page.

In practice, the memory controller 110 may perform various control operations by using its own internal components. For example, the memory controller 110 may use the memory interface 114 to control the access operations (especially the access operation for at least a memory block or at least a page) of the memory device 120, use the buffer memory 116 to perform necessary data buffer operations, and use the host interface 118 to communicate with the host device 130.

In an embodiment of the invention, the memory controller 110 may use the host interface 118 to communicate with the host device 130 in compliance with a standard communication protocol. For example, the standard communication protocol may comprise (but is not limited to) the Universal Serial Bus (USB) standard, the SD interface standard, the Ultra High Speed-I (UHS-I) interface standard, the Ultra High Speed-II (UHS-II) interface standard, the CF interface standard, the Multi Media Card (MMC) interface standard, the eMMC interface standard, the UFS interface standard, the Advanced Technology Attachment (ATA) standard, the Serial ATA (SATA) standard, the Peripheral Component Interconnect Express (PCI-E) standard, the Parallel Advanced Technology Attachment (PATA) standard, etc.

In an embodiment, the buffer memory 116 for buffering data may be implemented by a RAM. For example, the buffer memory 116 may be an SRAM, but the invention should not be limited thereto. In other embodiments, the buffer memory 116 may be a DRAM.

In an embodiment of the invention, the data storage device 100 may be a portable storage device (for example, the memory card in compliance with the SD/MMC, CF, MS and/or XD standard, the USB flash drive, or the likes), and the host device 130 may be an electronic device, such as a mobile phone, a notebook computer, a desktop computer . . . . etc., capable of connecting to the data storage device. In another embodiment of the invention, the data storage device 100 may be a solid state hard disk or an embedded storage device in compliance with the UFS or the eMMC standards, and may be equipped in an electronic device such as a mobile phone, a notebook computer, or a desktop computer. In such an embodiment, the host device 130 may be a processor of the electronic device.

According to an embodiment of the invention, the host interface 118 of the memory controller 110 may comprise a Serializer-Deserializer (SerDes) configured to process a reception signal received from a host device and a transmission signal to be transmitted to the host device, so as to realize high speed data transmission between the data storage device 100 and the host device 130.

Figure 2:
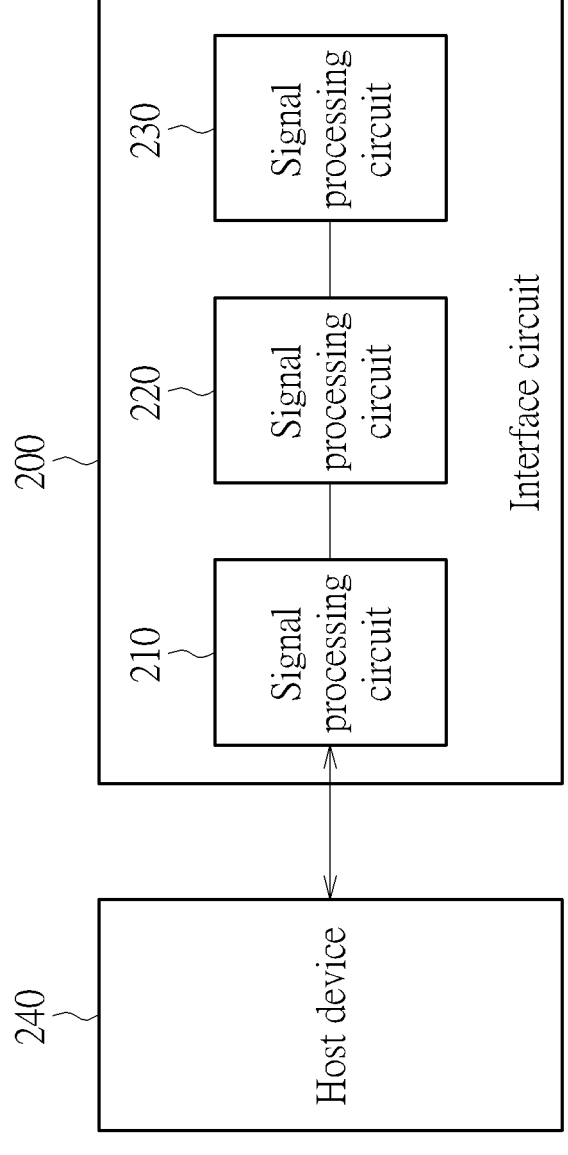
FIG. 2 is an exemplary block diagram of an interface circuit according to an embodiment of the invention.

FIG. 2 is an exemplary block diagram of an interface circuit according to an embodiment of the invention. According to an embodiment of the invention, the interface circuit 200 may be a host interface disposed between a predetermined device (as an example, a data storage device) and a host device for the host device and the predetermined device to communicate with each other through the interface circuit 200 and transmit data signal and control signal therethrough. According to an embodiment of the invention, the interface circuit 200 may be the host interface 118 configured inside the memory controller 110 as shown in FIG. 1.

The interface circuit 200 may comprise signal processing circuits 210, 220 and 230 that operate in compliance with different layer communication protocols. The signal processing circuit 210 may be the physical layer signal processing circuit to process reception signals received from the host device 240 and the transmission signals to be transmitted to the host device 240 in compliance with physical layer communication protocol. As an example, the signal processing circuit 210 may perform physical layer operations, such as amplification or attenuation, analog-to-digital or digital-to-analog conversion, frequency mixing, basic encoding or decoding, and unpacking of physical layer packet, on the reception signals and transmission signals. The signal processing circuit 220 may be the protocol layer signal processing circuit configured to perform corresponding signal processing on reception signals and the transmission signals in compliance with another layer communication protocol above the physical layer. As an example, the signal processing circuit 220 may perform signal processing on the reception signals and the transmission signals in compliance with the Unified Protocol (UniPro) developed by the Mobile Industry Processor Interface (MIPI) alliance. The signal processing circuit 220 may comprise multiple layers of signal processing circuits, for example, a physical adapter (PA) layer signal processing circuit which is coupled to the physical layer signal processing circuit, and other layers of signal processing circuits. The signal processing circuit 230 may be the application layer signal processing circuit configured to perform higher layer signal processing in compliance with the application layer protocol.

In the embodiments of the invention, the signal processing circuit 210 may be a SerDes or may be the physical layer signal processing circuit of the SerDes, to implement the high-speed data and signal transmission between the aforementioned predetermined device and host device.

Figure 3:
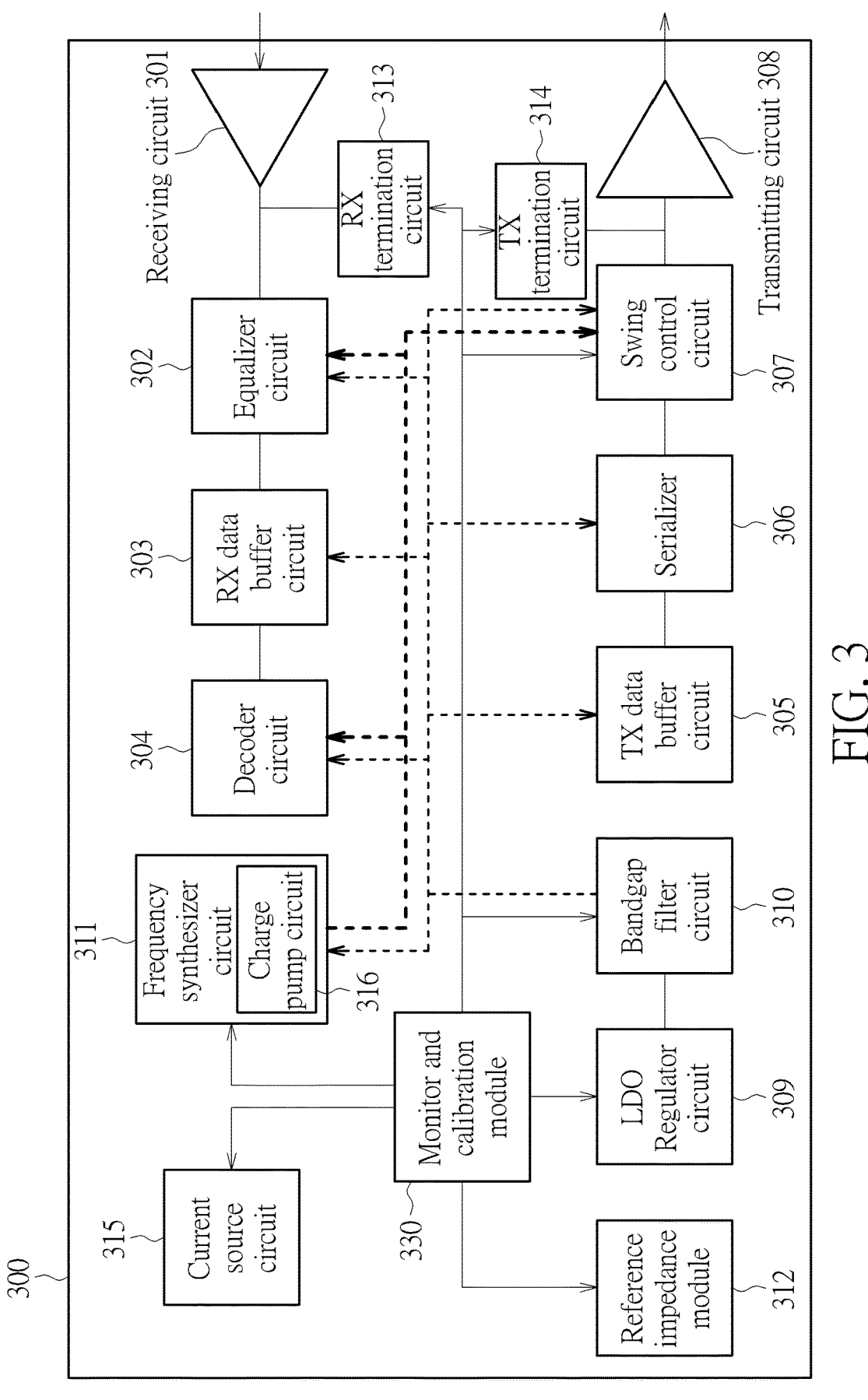
FIG. 3 is an exemplary block diagram of a signal processing circuit according to an embodiment of the invention.

FIG. 3 is an exemplary block diagram of a signal processing circuit according to an embodiment of the invention. In this embodiment, the signal processing circuit 300 may be a physical layer signal processing circuit configured inside an interface circuit, such as the physical layer signal processing circuit in the host interface of a memory controller, or the signal processing circuit 300 may be a Serializer-Deserializer (SerDes) or the physical layer signal processing circuit of the SerDes, and the signal processing circuit 300 may be configured to process the reception signals and the transmission signals.

The signal processing circuit 300 may comprise a plurality of signal processing devices and a monitor and calibration module 330. The monitor and calibration module 330 may be a circuit set which comprises a plurality of monitor circuits and a plurality of calibration circuits, and may be coupled to the plurality of signal processing devices. The monitor circuits are configured to monitor and/or measure at least one of an amplitude, a frequency and a jitter in at least one of the reception signal and the transmission signal and monitor and/or measure at least one of unexpected power drop and voltage bounce, and the calibration circuits are configured to sequentially calibrate a characteristic value of the signal processing devices in a monitor and calibration procedure based on the monitored and/or measured results. Note that in the embodiments of the invention, the 'monitor operation' or 'monitoring operation' performed by the monitor circuits inherently comprise one or more measurement operations, e.g., when a monitor circuit monitors a feature of a signal processing device, the monitor circuit may keep measuring the value of the feature and may determine a change or a trend of change in the value of the feature. As those skilled in the art will be readily appreciated inherent operations comprised in a monitor operation, repeated descriptions will be omitted for brevity.

The signal processing devices in the signal processing circuit 300 may comprise a receiving circuit 301, an equalizer circuit 302, a reception (RX) data buffer circuit 303, a decoder circuit 304, a transmission (TX) data buffer circuit 305, a serializer 306, a swing control circuit 307, a transmitting circuit 308, a Low DropOut (LDO) Regulator circuit 309, a bandgap filter circuit 310, a frequency synthesizer circuit 311, a reference impedance module 312, a RX termination circuit (reception termination circuit) 313, a TX termination circuit (transmission termination circuit) 314, a charge pump circuit 316 and at least one current source circuit 315.

It is to be noted that FIG. 3 is a simplified schematic diagram of a signal processing circuit, in which only the components related to the invention are shown. Those skilled in the art will be readily appreciated that a physical layer signal processing circuit may also comprise many components not shown in FIG. 3 to implement the corresponding physical layer signal processing functions.

On the reception signal processing path, the receiving circuit 301 is configured to receive signal from the host device. The RX termination circuit 313 is coupled to the reception signal processing path to provide a predetermined impedance on the reception signal processing path, for the load on the reception signal processing path to match with the impedance of the signal transmission line. The equalizer circuit 302 is configured to perform equalization on the reception signals. The equalizer circuit 302 may comprise a Continuous Time Linear Equalizer (CTLE), a Clock Data Recovery (CDR) circuit and a Deserializer (not shown in FIG. 3). The CTLE is configured to process the reception signal which being a serial signal. The CDR circuit is configured to regenerate the clock signal which is synchronized with the one used at the transmitter side and to accurately recover the content of the data signal carried in the reception signal according to the clock signal. The Deserializer is configured to convert the serial data signal into a plurality of parallel signals transmitted in parallel through a plurality of buses and output the parallel signals. The RX data buffer circuit 303 is configured to buffer the reception data output by the equalizer circuit 302. The decoder circuit 304 is configured to decode the reception data. The decoded reception data is further provided to the upper layer signal processing circuit, such as the physical adapter (PA) layer signal processing circuit.

On the transmission signal processing path, the TX data buffer circuit 305 is configured to buffer the transmission data, e.g., parallel data signals, received from the upper layer signal processing circuit. The serializer 306 is configured to convert the parallel data signals into a serial data signal. The swing control circuit 307 is configured to control the swing of transmission signal, for example, adjust the voltage of the transmission signal to an adequate level. The transmitting circuit 308 is configured to transmit the transmission signal to the host device. The TX termination circuit 314 is coupled to the transmission signal processing path to provide a predetermined impedance on the transmission signal processing path, for the load on the transmission signal processing path to match with the impedance of the signal transmission line.

Besides the signal processing devices on the aforementioned reception signal processing path and transmission signal processing path, the signal processing circuit 300 may also comprise some common circuits configured to provide the frequency, current, voltage, power and/or information regarding reference impedance that are required by other signal processing devices. The LDO Regulator circuit 309 is configured to provide stable voltage signal, as an example, provide stable voltage signal to the bandgap filter circuit 310. The bandgap filter circuit 310 is configured to filter the noise in the voltage signal, so as to provide clean voltage signal to the other signal processing devices (such as the arrows with thin dotted line in FIG. 3). The frequency synthesizer circuit 311 is configured to generate the clock signal required in the signal processing circuit 300 and provide the clock signal to the other signal processing devices (such as the arrows with thick dotted line in FIG. 3). In an embodiment of the invention, the frequency synthesizer circuit 311 may be implemented by a Phase Locked Loop (PLL) and configured to generate an oscillating signal provided as the clock signal required in the signal processing circuit 300, and may comprise a charge pump circuit 316 configured to generate an output voltage V_CP as an input signal provided to a voltage controlled oscillator (VCO) comprised in the PLL.

The reference impedance module 312 may comprise a plurality of reference passive devices, as an example, the reference resistors, reference capacitors, the reference inductors, or the likes, that are provided as reference impedance. Since the characteristic values of the passive devices, such as the corresponding resistance, capacitance, inductance, or the likes, may drift due to the process variation, the reference impedance module 312 comprising the passive devices made by the same process may be configured inside the signal processing circuit 300 to provide information regarding the reference impedance. As an example, suppose that 10 Kohms is achieved by connecting the two reference resistive devices in the reference impedance module 312 in serial, this information may be provided as reference impedance information. When a signal processing device inside the signal processing circuit 300 requires the resistance of 10 Kohms, two resistors inside this signal processing device may be connected together in serial by controlling the internal switch circuit thereof according to the reference impedance information. When another signal processing device inside the signal processing circuit 300 requires the resistance of 20 Kohms, four resistors inside this signal processing device may be connected together in serial by controlling the internal switch circuit thereof according to the reference impedance information. By using the reference impedance information obtained in the same circuit to flexibly control the number of passive devices to be connected in parallel or serial, the problem of characteristic value drift due to process variation is effectively overcome. The application regarding the corresponding reference impedance information of other passive devices comprised in the reference impedance module 312 may be deduced by analogy. The current source circuit 315 is configured to provide a current required by the signal processing devices in the signal processing circuit 300.

According to an embodiment of the invention, the monitor and calibration module may comprise a plurality of monitor circuits and a plurality of calibration circuits. Each monitor circuit and each calibration circuit may be coupled to one or more corresponding signal processing devices. The monitor circuit may keep measuring and/or monitoring a frequency, an amplitude or a jitter of a signal processed by the corresponding signal processing devices, or measuring or monitoring unexpected power drop or voltage bounce. The calibration circuit may calibrate a characteristic value of each signal processing device according to the measured or monitored result.

Figure 4:
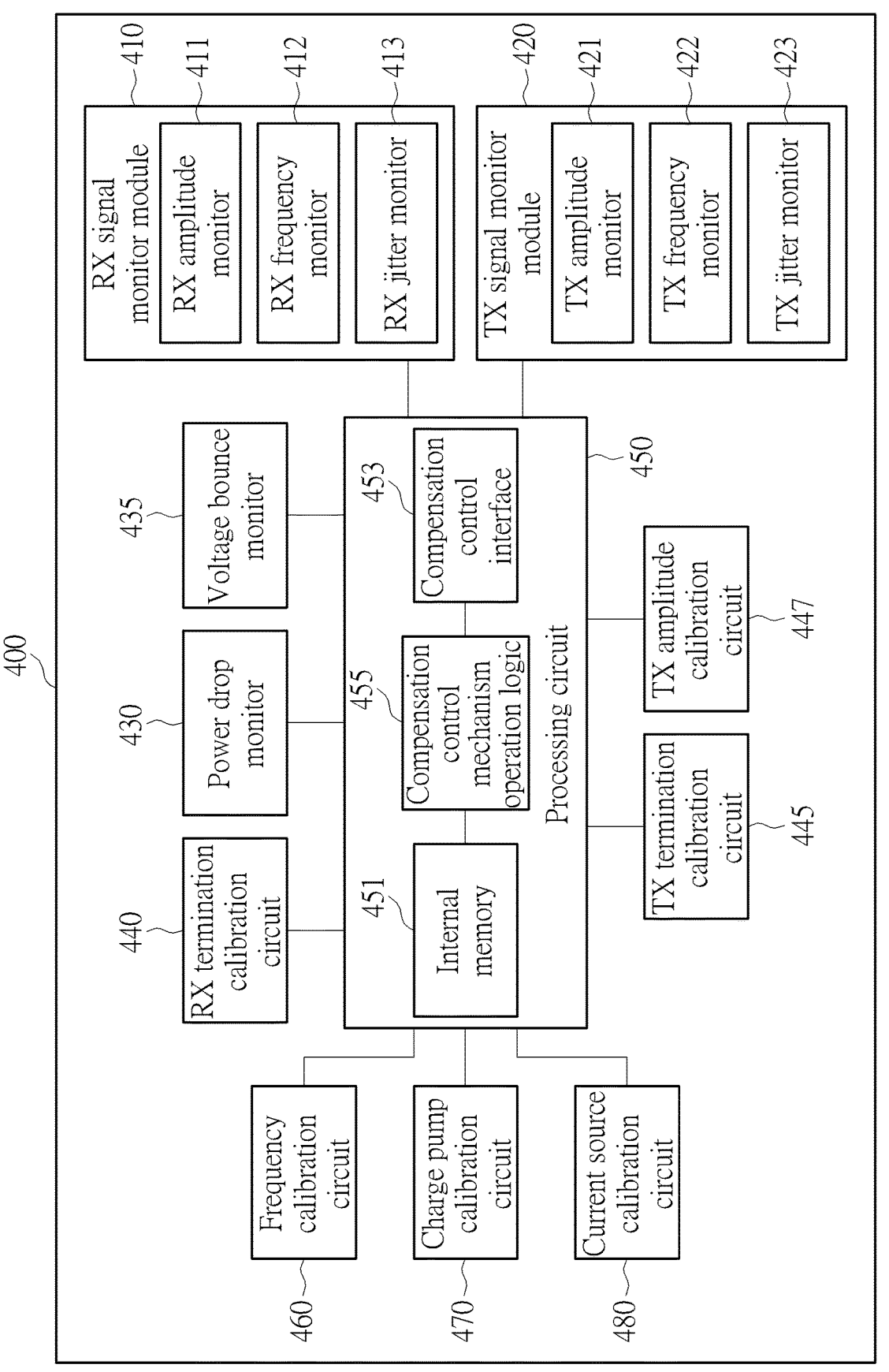
FIG. 4 is an exemplary block diagram of a monitor and calibration module according to an embodiment of the invention.

FIG. 4 is an exemplary block diagram of a monitor and calibration module according to an embodiment of the invention. The monitor and calibration module 400 may comprise a plurality of monitor circuits and a plurality of calibration circuits and a processing circuit 450.

According to an embodiment of the invention, the monitor and calibration module 400 may comprise a RX signal monitor module 410, a TX signal monitor module 420, a power drop monitor 430 and a voltage bounce monitor 435. The RX signal monitor module 410 may comprise a RX amplitude monitor (i.e., reception amplitude monitor) 411, a RX frequency monitor (i.e., reception frequency monitor) 412 and a RX jitter monitor (i.e., reception jitter monitor) 413. The TX signal monitor module 420 may comprise a TX amplitude monitor (i.e., transmission amplitude monitor) 421, a TX frequency monitor (i.e., transmission frequency monitor) 422 and a TX jitter monitor (i.e., transmission jitter monitor) 423.

In addition, the monitor and calibration module 400 may comprise a RX termination calibration circuit (i.e., reception termination calibration circuit) 440, a TX termination calibration circuit (i.e., transmission termination calibration circuit) 445, a TX amplitude calibration circuit 447, a frequency calibration circuit 460, a charge pump calibration circuit 470 and a current source calibration circuit 480.

The processing circuit 450 may comprise an internal memory 451, a compensation control interface 453 and a compensation control mechanism operation logic 455. The compensation control interface 453 is an interface connecting the compensation control mechanism operation logic 455 with a plurality of peripheral monitor circuits and calibration circuits. For example, the compensation control interface 453 may be physical traces or buses. The compensation control mechanism operation logic 455 may collect monitored results from the peripheral monitor circuits and may implement a compensation control mechanism to determine at least one calibration operation based on the monitored results, as an example, the compensation control mechanism operation logic 455 may be configured to sequentially generate a calibration control signal corresponding to each calibration circuit based on to the monitored results, so as to respectively control the corresponding calibration circuit to perform the corresponding calibration operation on the signal processing devices in response to the corresponding calibration control signal.

According to an embodiment of the invention, the compensation control mechanism operation logic 455 may be implemented by a Field Programmable Gate Array (FPGA). The internal memory 451 may at least comprise a nonvolatile memory, and further comprise a random access memory (RAM) for storing information regarding the Netlist required for programming the compensation control mechanism operation logic 455 and storing the data collected or generated when performing the monitor and calibration procedure. When the Netlist is loaded into the compensation control mechanism operation logic 455, the compensation control mechanism operation logic 455 completes the connection of the electronic circuits and the related information transmission according to the content described in the Netlist, so as to implement the proposed compensation control mechanism and the monitor and calibration procedure.

According to an embodiment of the invention, the monitor circuits may be configured to monitor at least one of an amplitude, a frequency and a jitter in at least one of the reception signal and the transmission signal to generate a monitored result corresponding to the at least one of the amplitude, the frequency and the jitter in the at least one of the reception signal and the transmission signal and monitor at least one of a power supplying voltage and a ground voltage to generate a monitored result corresponding to the at least one of the power supplying voltage and the ground voltage. To be more specific, the RX amplitude monitor 411 may be coupled to the receiving circuit 301 or the equalizer circuit 302 to monitor and/or measure the amplitude of the reception signal received by the signal processing circuit 300. The RX amplitude monitor 411 may monitor and/or measure the reception signal when it is still a serial signal, and the amplitude measured by the RX amplitude monitor 411 may reflect a direct current (DC) component of the reception signal. In the embodiments of the invention, the RX amplitude monitor 411 may keep measuring and monitoring the reception signal and report the monitored results to the processing circuit 450, where the monitored results may comprise a plurality of measured values and may further comprise a comparison or decision result regarding whether a measured value exceeds a margin (e.g., a tolerance margin). As an example, the RX amplitude monitor 411 may compare a measured value with a target amplitude and determine whether a difference between the measured value and the target amplitude is greater than an amplitude drift threshold of the reception signal.

The RX frequency monitor 412 may be coupled to the equalizer circuit 302 to monitor and/or measure a frequency of the reception signal. As an example, the RX frequency monitor 412 may sample the reception signal after it has been converted into a plurality of parallel signals, such as sampling the data portion of the reception signals or sampling the clock signal carried in the reception signals, and may measure the pulse width when the signal is in a high voltage level and the pulse width when the signal is in a low voltage level, thereby estimating the frequency of the reception signal or the clock signal. In the embodiments of the invention, the RX frequency monitor 412 may keep measuring and monitoring the reception signal and report the monitored results to the processing circuit 450, where the monitored results may comprise a plurality of measured values and may further comprise a comparison or decision result regarding whether a measured value exceeds a margin (e.g., a tolerance margin). As an example, the RX frequency monitor 412 may compare a measured value with a target frequency and determine whether a difference between the measured value and the target frequency is greater than a frequency drift threshold.

The RX jitter monitor 413 may be coupled to the receiving circuit 301 or the equalizer circuit 302 to monitor and/or measure the jitters in the reception signal received by the signal processing circuit 300. The RX jitter monitor 413 may monitor the reception signal when it is still a serial signal, and the amplitude measured by the RX amplitude monitor

411 may reflect an alternating current (AC) component of the reception signal. In the embodiments of the invention, the RX jitter monitor 413 may keep measuring and monitoring the reception signal and report the monitored results to the processing circuit 450, where the monitored results may comprise a plurality of measured values and may further comprise a comparison or decision result regarding whether a measured value exceeds a margin (e.g., a tolerance margin). As an example, the RX jitter monitor 413 may compare a measured value with a jitter upper limit and determine whether the measured value is greater than the jitter upper limit of the transmission signal.

Likely, the TX amplitude monitor 421 may be coupled to the transmitting circuit 308 or the swing control circuit 307 to measure the amplitude of the transmission signal to be transmitted by the signal processing circuit 300. The TX amplitude monitor 421 may monitor and/or measure the transmission signal after it has been converted into a serial signal, and the amplitude measured by the TX amplitude monitor 421 may reflect a DC component of the transmission signal. In the embodiments of the invention, the TX amplitude monitor 421 may keep measuring and monitoring the transmission signal and report the monitored results to the processing circuit 450, where the monitored results may comprise a plurality of measured values and may further comprise a comparison or decision result regarding whether a measured value exceeds a margin (e.g., a tolerance margin). As an example, the TX amplitude monitor 421 may compare a measured value with a target amplitude and determine whether a difference between the measured value and the target amplitude is greater than an amplitude drift threshold of the transmission signal.

The TX frequency monitor 422 may be coupled to the TX data buffer circuit 305 to monitor and/or measure a frequency of the transmission signal. As an example, the TX frequency monitor 422 may sample the transmission signals when they are still parallel signals, such as sampling the data portion of the transmission signals or sampling the clock signal carried in the transmission signals, and may measure the pulse width when the signal is in a high voltage level and the pulse width when the signal is in a low voltage level, thereby estimating the frequency of the transmission signal or the clock signal. In the embodiments of the invention, the TX frequency monitor 422 may keep measuring and monitoring the transmission signal and report the monitored results to the processing circuit 450, where the monitored results may comprise a plurality of measured values and may further comprise a comparison or decision result regarding whether a measured value exceeds a margin (e.g., a tolerance margin). As an example, the TX frequency monitor 422 may compare a measured value with a target frequency and determine whether a difference between the measured value and the target frequency is greater than a frequency drift threshold.

The TX jitter monitor 423 may be coupled to the transmitting circuit 308 or the swing control circuit 307 to monitor and/or measure the jitters in the transmission signal to be transmitted by the signal processing circuit 300. The TX jitter monitor 423 may monitor the transmission signal after it has been converted into a serial signal, and the amplitude measured by the TX jitter monitor 423 may reflect an AC component of the transmission signal. In the embodiments of the invention, the TX jitter monitor 423 may keep measuring and monitoring the transmission signal and report the monitored results to the processing circuit 450, where the monitored results may comprise a plurality of measured values and may further comprise a comparison or decision result regarding whether a measured value exceeds a margin (e.g., a tolerance margin). As an example, the TX jitter monitor 423 may compare a measured value with a jitter upper limit and determine whether the measured value is greater than the jitter upper limit of the transmission signal.

The power drop monitor 430 may be coupled to a power supplier, such as the power supplier for providing the power supplying voltage VDD, to monitor and/or measure the power drop in the power supplying voltage VDD. In the embodiments of the invention, the power drop monitor 430 may keep measuring and monitoring the power supplying voltage and report the monitored results to the processing circuit 450, where the monitored results may comprise a plurality of measured values and may further comprise a comparison or decision result regarding whether a measured value exceeds a margin (e.g., a tolerance margin). As an example, the power drop monitor 430 may compare a measured value with a power drop upper limit and determine whether the measured value is greater than the power drop upper limit.

The voltage bounce monitor 435 may be coupled to a ground voltage supplier for providing the ground voltage GND, to monitor and/or measure the amount of voltage bounce in the ground voltage GND. In the embodiments of the invention, the voltage bounce monitor 435 may keep measuring and monitoring the ground voltage GND and report the monitored results to the processing circuit 450, where the monitored results may comprise a plurality of measured values and may further comprise a comparison or decision result regarding whether a measured value exceeds a margin (tolerance margin). As an example, the power drop monitor 430 may compare a measured value with a ground bounce upper limit and determine whether the measured value is greater than the ground bounce upper limit.

The calibration circuits in the monitor and calibration module 400 may be coupled to the processing circuit 450 and may be coupled to at least a corresponding signal processing device in the signal processing circuit 300, for performing the calibration operation on the signal processing device in response to a calibration control signal issued by the compensation control mechanism operation logic 455, so as to adjust a characteristic value of the signal processing device. To be more specific, the RX termination calibration circuit 440 may be coupled to the RX termination circuit 313 or the reference impedance module 312 to perform calibration operation on the RX termination circuit 313 and/or the reference impedance module 312 according to the calibration data provided by the compensation control mechanism operation logic 455, thereby adjusting an impedance value of the predetermined impedance configured inside the RX termination circuit 313 and/or adjusting at least one of the reference resistance, reference capacitance and reference inductance of the reference impedance module 312.

The TX termination calibration circuit 445 may be coupled to the TX termination circuit 314 or the reference impedance module 312 to perform calibration operation on the TX termination circuit 314 and/or the reference impedance module 312 according to the calibration data provided by the compensation control mechanism operation logic 455, thereby adjusting an impedance value of the predetermined impedance configured inside the TX termination circuit 314 and/or adjust at least one of the reference resistance, reference capacitance and reference inductance of the reference impedance module 312.

The TX amplitude calibration circuit 447 may be coupled to the swing control circuit 307 and/or the TX termination circuit 314 to perform calibration operation on the swing control circuit 307 and/or the TX termination circuit 314 according to the calibration data provided by the compensation control mechanism operation logic 455, thereby adjusting a voltage level of an output signal, such as the transmission signal, output by the swing control circuit 307 and/or adjust an impedance value of the predetermined impedance configured inside the TX termination circuit 314.

The frequency calibration circuit 460 may be coupled to the frequency synthesizer circuit 311 to perform calibration operation on the frequency synthesizer circuit 311 according to the calibration data provided by the compensation control mechanism operation logic 455, thereby adjusting a start-up voltage of the VCO in the frequency synthesizer circuit 311. As an example, if the compensation control mechanism operation logic 455 determines that a measured frequency has not reached the target frequency, the compensation control mechanism operation logic 455 may determine to increase the start-up voltage of the VCO for the frequency of the oscillating signal generated by the frequency synthesizer circuit 311 to reach the target frequency faster.

The charge pump calibration circuit 470 may be coupled to the frequency synthesizer circuit 311 or the charge pump circuit 316 to perform calibration operation on the charge pump circuit 316 according to the calibration data provided by the compensation control mechanism operation logic 455, thereby adjusting the frequency of a clock signal received by the charge pump circuit 316 or adjusting a level of an output voltage of the charge pump circuit 316. As an example, if the compensation control mechanism operation logic 455 determines that a measured frequency has not reached the target frequency, the compensation control mechanism operation logic 455 may determine to increase the frequency of the clock signal received by the charge pump circuit 316 or adjust the level of the output voltage V_CP generated by the charge pump circuit 316 for the level of the output voltage V_CP to reach the corresponding target value faster. Similarly, if the compensation control mechanism operation logic 455 determines that a measured frequency exceeds the target frequency, the compensation control mechanism operation logic 455 may determine to decrease the frequency of the clock signal received by the charge pump circuit 316 or adjust the level of the output voltage V_CP generated by the charge pump circuit 316 so that the level of the output voltage V_CP can be reduced.

The current source calibration circuit 480 may be coupled to the current source circuit 315 to perform calibration operation on the current source circuit 315 according to the calibration data provided by the compensation control mechanism operation logic 455, to adjust the amount or the level of the current provided by the current source circuit 315.

It is to be noted that in some embodiments of the invention, the calibration circuit may be an independent circuit and may be coupled to the corresponding signal processing device to be calibrated, so as to calibrate a characteristic value of the signal processing device. However, the invention is not limited thereto. In other embodiments of the invention, the calibration circuit may also be implemented as a portion of the signal processing devices to be calibrated. That is, one or more of the signal processing devices to be calibrated may comprise a built-in calibration circuit to calibrate the corresponding characteristic value according to the measured/monitored results and/or the calibration data.

Figure 5:
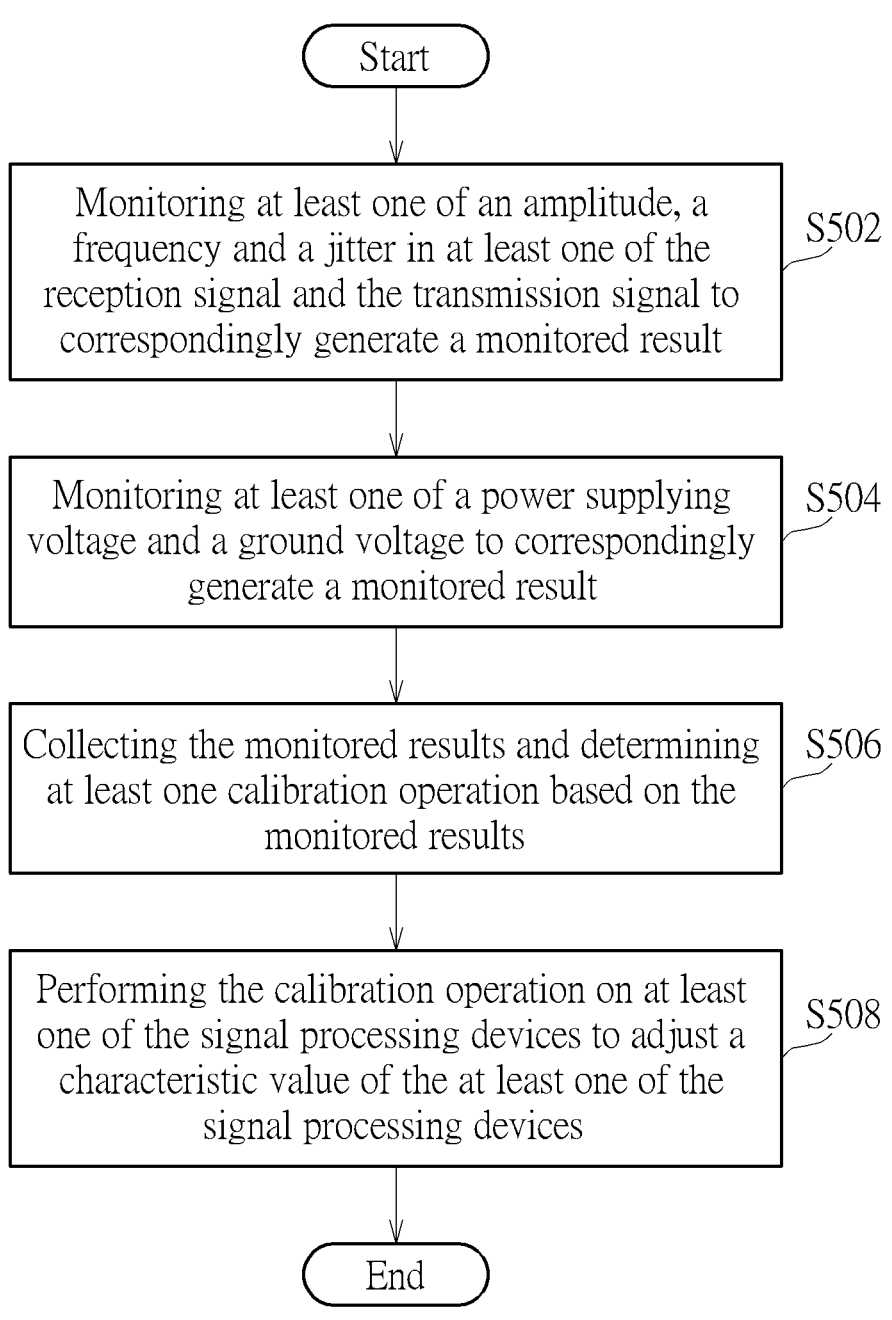
FIG. 5 shows an exemplary flow chart of a calibration method for calibrating characteristic values of a plurality of signal processing devices according to an embodiment of the invention.

FIG. 5 shows an exemplary flow chart of a calibration method for calibrating characteristic values of a plurality of signal processing devices according to an embodiment of the invention. The calibration method may comprise the following steps performed by the monitor and calibration module 330/400:

Step S502: monitoring at least one of an amplitude, a frequency and a jitter in at least one of the reception signal and the transmission signal to correspondingly generate a monitored result.

Step S504: monitoring at least one of a power supplying voltage and a ground voltage to correspondingly generate a monitored result.

Step S506: collecting the monitored results and determining at least one calibration operation based on the monitored results.

Step S508: performing the calibration operation on at least one of the signal processing devices to adjust a characteristic value of the at least one of the signal processing devices.

In the proposed calibration method, the monitor and calibration module may be utilized to actively measure the signal processing devices and calibrate the signal processing devices based on the proposed compensation control mechanism, so as to compensate for drift in current, voltage and/or frequency in real-time and to avoid fatal error.

Figure 6:
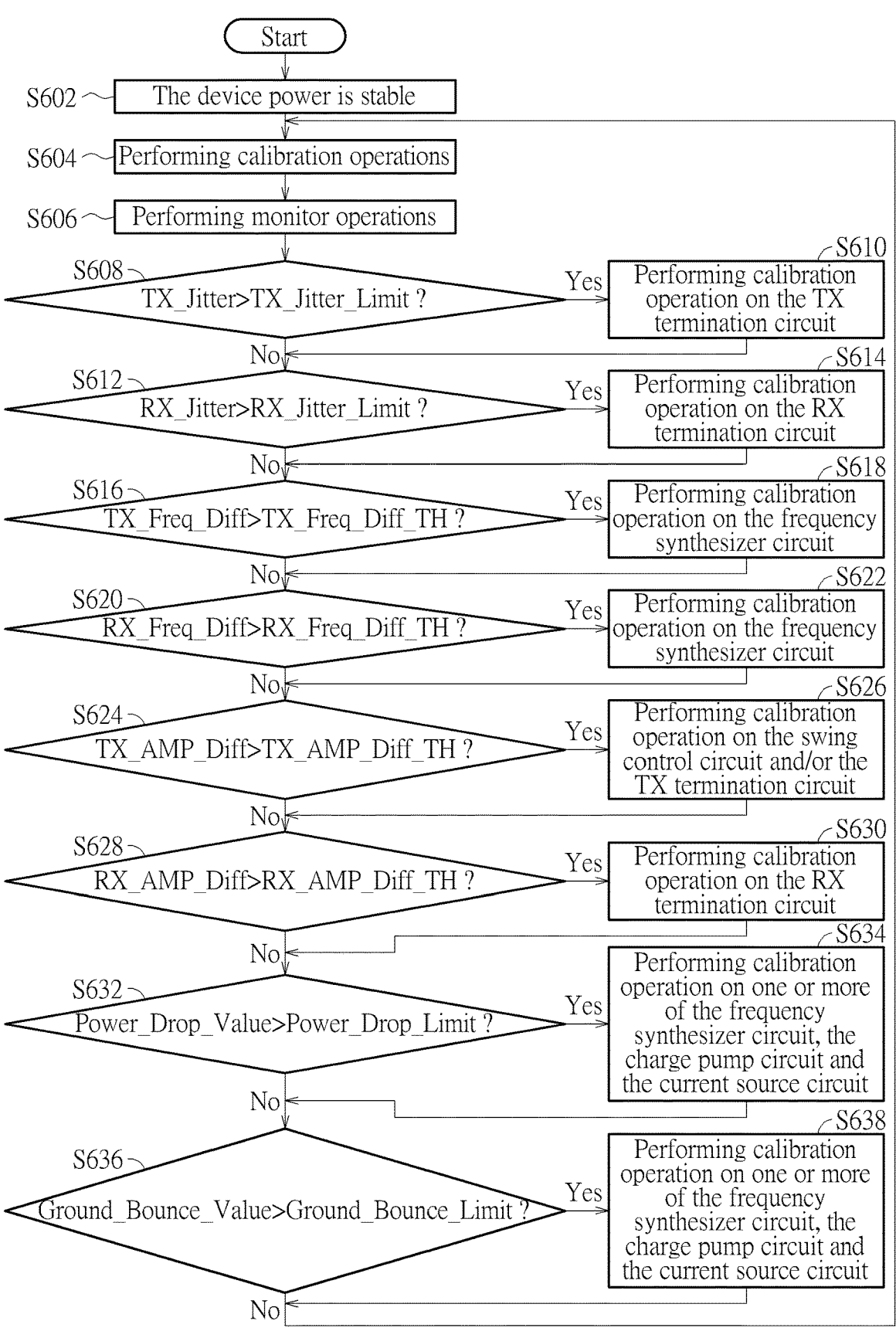
FIG. 6 shows an exemplary flow chart of a monitor and calibration procedure when implementing the proposed calibration method according to an embodiment of the invention.

FIG. 6 shows an exemplary flow chart of a monitor and calibration procedure when implementing the proposed calibration method according to an embodiment of the invention. The monitor and calibration procedure may comprise the following steps:

Step S602: Powering up the data storage device 100 and stabilizing the supplied power of the data storage device 100.

Step S604: Performing a corresponding calibration operation on one or more of the signal processing devices in the signal processing circuit 300. According to an embodiment of the invention, when the supplied power of the data storage device 100 is stable, the corresponding calibration operation may be directly performed on the one or more of the signal processing devices, and the calibration operation performed now may be a preliminary blind tuning operation. As an example, the calibration data may be set to any value, or the characteristic value of a signal processing device may be set directly to the target value thereof. For example, in this step, the charge pump calibration circuit 470, the current source calibration circuit 480, the TX amplitude calibration circuit 447, the TX termination calibration circuit 445, the RX termination calibration circuit 440, and the frequency calibration circuit 460 may be sequentially activated to perform the corresponding calibration operation.

Step S606: sequentially activating the monitors/monitor circuits in the monitor and calibration module to perform the corresponding monitor operations. According to an embodiment of the invention, since the drift or deviation in frequency and/or voltage may possibly occur in the SerDes which operates in high speed, after the preliminary calibration or setting performed in step S604, the corresponding monitors/monitor circuits may start to actively monitor of the signal processing devices in the signal processing circuit 300 and may keep monitoring and measuring them. In addition, according to an embodiment of the invention, after obtaining the monitored results, the monitors/monitor circuits may directly report the monitored results to the processing circuit 450.

Step S608: determining whether the amount of jitter (TX_Jitter) measured or monitored by TX jitter monitor 423 is greater than the jitter upper limit (TX_Jitter_Limit). If the determination result shows 'Yes', it means that the measured value exceeds the tolerance margin, and step S610 is performed. If the determination result shows 'No', step S612 is performed.

Step S610: controlling the TX termination calibration circuit 445 to perform calibration operation on the TX termination circuit 314 and/or the reference impedance module 312 according to the calibration data provided by the compensation control mechanism operation logic 455 to adjust an impedance value of the predetermined impedance configured inside the TX termination circuit 314 and/or adjust at least one of the reference resistance, reference capacitance and reference inductance of the reference impedance module 312. For example, the TX termination calibration circuit 445 may increase the impedance of the TX termination circuit 314 according to the calibration data to reduce the jitters in the transmission signal.

Step S612: determining whether the amount of jitter (RX_Jitter) measured or monitored by RX jitter monitor 413 is greater than the jitter upper limit (RX_Jitter_Limit). If the determination result shows 'Yes', it means that the measured value exceeds the tolerance margin, and step S614 is performed. If the determination result shows 'No', step S616 is performed.

Step S614: controlling the RX termination calibration circuit 440 to perform calibration operation on the RX termination circuit 313 and/or the reference impedance module 312 according to the calibration data provided by the compensation control mechanism operation logic 455 to adjust an impedance value of the predetermined impedance configured inside the RX termination circuit 313 and/or adjust at least one of the reference resistance, reference capacitance and reference inductance of the reference impedance module 312. For example, the RX termination calibration circuit 440 may increase the impedance of the RX termination circuit 313 according to the calibration data to reduce the jitters in the reception signal.

Step S616: determining whether a difference (TX_Freq_Diff) between a value measured or monitored by the TX frequency monitor 422 and a target frequency is greater than a frequency drift threshold (TX_Freq_Diff_TH). If the determination result shows 'Yes', it means that the measured value exceeds the tolerance margin, and step S618 is performed. If the determination result shows 'No', step S620 is performed.

Step S618: controlling the frequency calibration circuit 460 to perform calibration operation on the frequency synthesizer circuit 311 according to the calibration data provided by the compensation control mechanism operation logic 455 to adjust a start-up voltage of the VCO in the frequency synthesizer circuit 311. In this step, the frequency calibration circuit 460 may perform the calibration operation on the frequency of the clock signal generated by the frequency synthesizer circuit 311 and required for generating the transmission signal.

Step S620: determining whether a difference (RX_Freq_Diff) between a value measured or monitored by the RX frequency monitor 412 and a target frequency is greater than a frequency drift threshold (RX_Freq_Diff_TH). If the determination result shows 'Yes', it means that the measured value exceeds the tolerance margin, and step S622 is performed. If the determination result shows 'No', step S624 is performed.

Step S622: controlling the frequency calibration circuit 460 to perform calibration operation on the frequency synthesizer circuit 311 according to the calibration data provided by the compensation control mechanism operation logic 455 to adjust a start-up voltage of the VCO in the frequency synthesizer circuit 311. In this step, the frequency calibration circuit 460 may perform the calibration operation on the frequency of the clock signal generated by the frequency synthesizer circuit 311 and required for generating the reception signal.

Step S624: determining whether a difference (TX_AMP_Diff) between a value measured or monitored by the TX amplitude monitor 421 and a target amplitude is greater than an amplitude drift threshold (TX_AMP_Diff_TH). In the embodiments of the invention, both the too large or too small TX amplitude may trigger the TX amplitude calibration. If the determination result shows 'Yes', it means that the measured value exceeds the tolerance margin, and step S626 is performed. If the determination result shows 'No', step S628 is performed.

Step S626: controlling the TX amplitude calibration circuit 447 to perform calibration operation on the swing control circuit 307 and/or the TX termination circuit 314 according to the calibration data provided by the compensation control mechanism operation logic 455 to adjust a voltage level of an output signal output by the swing control circuit 307 and/or adjust an impedance value of the predetermined impedance configured inside the TX termination circuit 314.

Step S628: determining whether a difference (RX_AMP_Diff) between a value measured or monitored by the RX amplitude monitor 411 and a target amplitude is greater than an amplitude drift threshold (RX_AMP_Diff_TH). In the embodiments of the invention, both the too large or too small RX amplitude may trigger the RX amplitude calibration. If the determination result shows 'Yes', it means that the measured value exceeds the tolerance margin, and step S630 is performed. If the determination result shows 'No', step S632 is performed.

Step S630: controlling the RX termination calibration circuit 440 to perform calibration operation on the RX termination circuit 313 and/or the reference impedance module 312 according to the calibration data provided by the compensation control mechanism operation logic 455 to adjust an impedance value of the predetermined impedance configured inside the RX termination circuit 313 and/or adjust at least one of the reference resistance, reference capacitance and reference inductance of the reference impedance module 312.

Step S632: determining whether an amount of power drop (Power_Drop_Value) in the power supplying voltage measured or monitored by the power drop monitor 430 is greater than a power drop upper limit (Power_Drop_Limit). If the determination result shows 'Yes', it means that the measured value exceeds the tolerance margin or power drop has occurred, and step S634 is performed. If the determination result shows 'No', step S636 is performed.

Step S634: controlling one or more of the frequency calibration circuit 460, the charge pump calibration circuit 470 and the current source calibration circuit 480 to perform calibration operation on the frequency synthesizer circuit 311, the charge pump circuit 316 and the current source circuit 315 according to the calibration data provided by the compensation control mechanism operation logic 455 to adjust a start-up voltage of the VCO in the frequency synthesizer circuit 311, adjust the frequency of the oscillating signal received by the charge pump circuit 316 or a level of an output voltage of the charge pump circuit 316 and the amount or the level of the current provided by the current source circuit 315.

Step S636: determining whether the amount of voltage bounce (Ground_Bounce_Value) in the ground voltage GND measured or monitored by the voltage bounce monitor 435 is greater than a ground bounce upper limit (Ground-_Bounce_Limit). If the determination result shows 'Yes', it means that the measured value exceeds the tolerance margin or ground bounce has occurred, and step S638 is performed. If the determination result shows 'No', step S604 is returned.

Step S638: controlling one or more of the frequency calibration circuit 460, the charge pump calibration circuit 470 and the current source calibration circuit 480 to perform calibration operation on the frequency synthesizer circuit 311, the charge pump circuit 316 and the current source circuit 315 according to the calibration data provided by the compensation control mechanism operation logic 455 to adjust a start-up voltage of the VCO in the frequency synthesizer circuit 311, adjust the frequency of the clock signal received by the charge pump circuit 316 or a level of an output voltage of the charge pump circuit 316 and the amount or the level of the current provided by the current source circuit 315.

In the embodiments of the invention, since the power drop or the ground bounce may both cause the characteristic value of the frequency synthesizer circuit 311, the characteristic value of the charge pump circuit 316 and/or the characteristic value of the current source circuit 315 to drift, when it is determined that the power drop or the ground bounce has occurred, the corresponding calibration circuit may be controlled to calibrate or reset the characteristic value of the frequency synthesizer circuit 311, the characteristic value of the charge pump circuit 316 and/or the characteristic value of the current source circuit 315, so as to calibrate or reset the corresponding characteristic value to its target value or to a value close to its target value.

It is to be noted that the flow shown in FIG. 6 to sequentially monitor and calibrate each signal processing device in the monitor and calibration procedure is only an embodiment of the invention, and is certainly not a limit of the invention. In the embodiments of the invention, the compensation control mechanism operation logic 455 may dynamically adjust the sequence and the content of calibration according to the monitored results reported by the monitors/monitor circuits.

Figure 7:
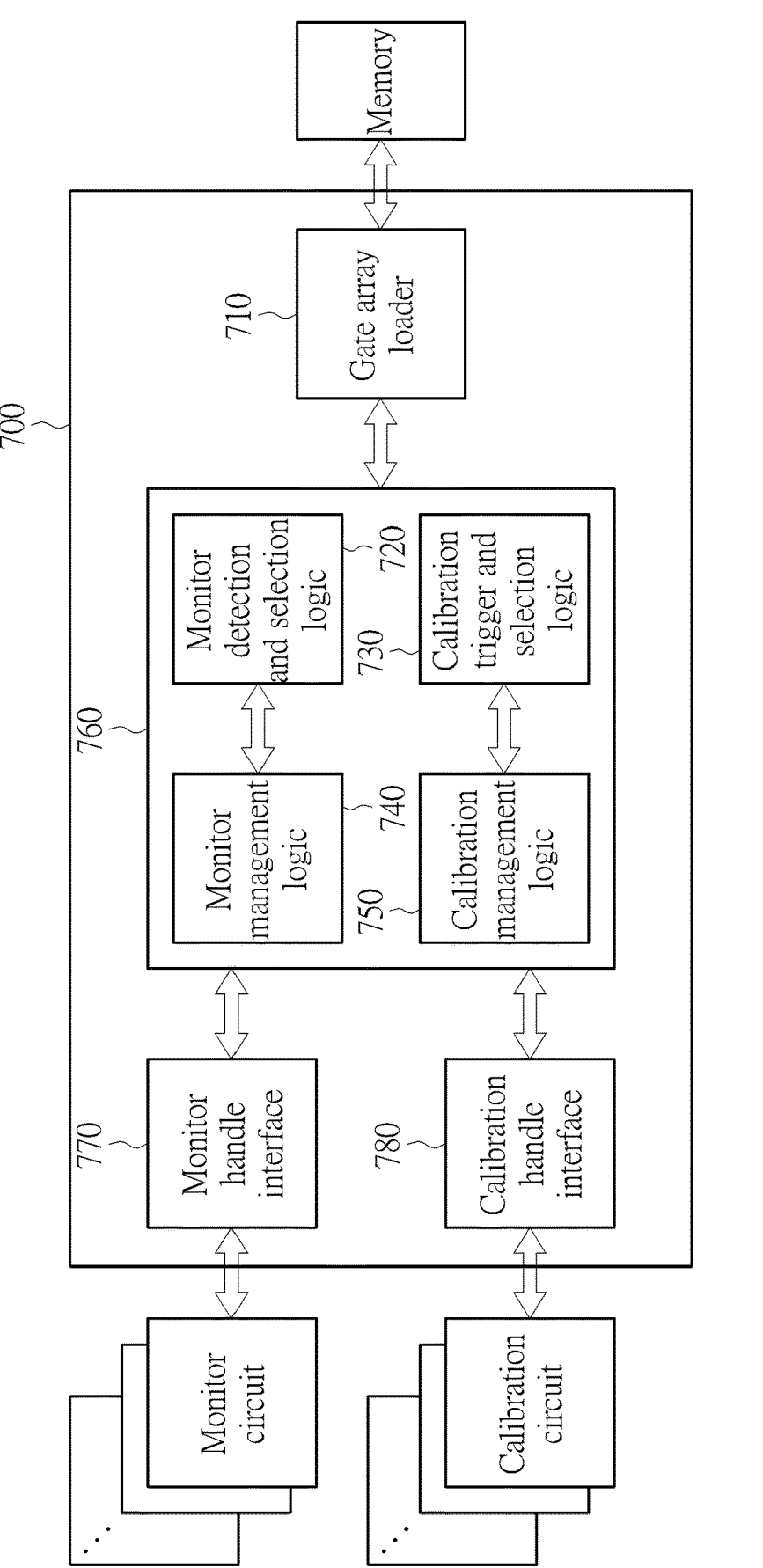
FIG. 7 is an exemplary block diagram of a compensation control mechanism operation logic according to an embodiment of the invention.

FIG. 7 is an exemplary block diagram of a compensation control mechanism operation logic according to an embodiment of the invention. The compensation control mechanism operation logic 700 may comprise a gate array loader 710, an FPGA slice block 760, a monitor handle interface 770 and a calibration handle interface 780. The FPGA slice block 760 may comprise a monitor detection and selection logic 720, a calibration trigger and selection logic 730, a monitor management logic 740 and a calibration management logic 750. According to an embodiment of the invention, the gate array loader 710 may load the aforementioned Netlist from the memory (e.g., the internal memory 451 configured inside the processing circuit 450 as shown in FIG. 4) and program the compensation control mechanism operation logic 700 according to the content of the Netlist. According to an embodiment of the invention, the compensation control mechanism operation logic 700 or at least the logic circuits comprised in the FPGA slice block 760 may be implemented by FPGA logic circuits, and the FPGA logic circuits may be programed by the gate array loader 710 based on the content of the Netlist.

The compensation control mechanism operation logic 700 may be coupled to a plurality of monitor circuits and a plurality of calibration circuits, such as the monitor circuits and calibration circuits shown in FIG. 4, to collect monitored results from the monitor circuits, determine a calibration sequence and accordingly generate calibration commands and sequentially generate a calibration control signal corresponding to each calibration circuit based on the calibration commands, so as to respectively control the corresponding calibration circuit to perform the corresponding calibration operation on at least one of the signal processing devices in response to the corresponding calibration control signal. In addition, the compensation control mechanism operation logic 700 may also collect calibration results from the calibration circuits, determine a monitoring sequence and accordingly generate monitor commands according to the calibration results and/or the monitored results, and sequentially generate a monitor control signal corresponding to each monitor circuit based on the monitor commands, so as to respectively control the monitor circuits to perform the corresponding monitor operation on at least one of the signal processing devices in response to the corresponding monitor control signal.

To be more specific, the monitor handle interface 770 may be coupled to the monitor circuits, and may be configured to receive a monitor command from the monitor management logic 740 and decode the monitor command to obtain information regarding which monitor circuit should perform the current monitor operation, and generate a monitor control signal according to a decoding result of the monitor command and provide the monitor control signal to the corresponding monitor circuit. The calibration handle interface 780 may be coupled to the calibration circuits, and may be configured to receive a calibration command from the calibration management logic 750 and decode the calibration command to obtain information regarding which calibration circuit should perform the current calibration operation, and generate a calibration control signal according to a decoding result of the calibration command and provide the calibration control signal to the corresponding calibration circuit.

The monitor management logic 740 may be coupled to the monitor handle interface 770 and configured to manage the monitor circuits through the monitor handle interface 770, buffer the monitored results collected from the monitor circuits and generate the monitor command according to a monitor selection control signal received from the monitor detection and selection logic 720, to activate one or more monitor circuits corresponding to the monitor command to perform the corresponding monitor operation(s). The monitor detection and selection logic 720 may be coupled to the monitor management logic 740 and configured to determine an activation sequence of the monitor circuits in the monitor and calibration procedure according to currently collected information, and correspondingly generate the monitor selection control signal.

The calibration management logic 750 may be coupled to the calibration handle interface 780 and configured to manage the calibration circuits through the calibration handle interface 780, buffer calibration results collected from the calibration circuits and generate the calibration command according to a calibration selection control signal received from the calibration trigger and selection logic 730, to activate one or more calibration circuits corresponding to the calibration command to perform the corresponding calibration operation(s). The calibration trigger and selection logic 730 may be coupled to the calibration management logic 750 and configured to determine an activation sequence of the calibration circuits in the monitor and calibration procedure according to currently collected information, and correspondingly generate a calibration selection control signal.

In the embodiments of the invention, the monitor detection and selection logic 720 and the calibration trigger and selection logic 730 may communicate with each other and may collect the current information through each other. As an example, besides the information regarding the current monitor operations and the current monitored results obtained from the monitor management logic 740, the monitor detection and selection logic 720 may also obtain the information regarding the current calibration operations and the current calibration results from the calibration trigger and selection logic 730. Similarly, besides the information regarding the current calibration operations and the current calibration results obtained from the calibration management logic 750, the calibration trigger and selection logic 730 may also obtain the information regarding the current monitor operations and the current monitored results from the monitor detection and selection logic 720. Therefore, the aforementioned currently collected information may comprise the information regarding the current calibration operations and the current calibration results and the information regarding the current monitor operations and the current monitored results obtained by the monitor detection and selection logic 720 and/or the calibration trigger and selection logic 730.

According to an embodiment of the invention, the monitor detection and selection logic 720 may determine content of a next monitor operation based on the currently collected information, where the content of a monitor operation may comprise the information regarding which monitor circuit is arranged to perform the monitor operation, the start time of the monitor operation and the length of execution time of the monitor operation, the target (for example, a current signal or a voltage signal, the reception signal or the transmission signal, or an amplitude, a frequency or jitters of a signal, etc.) to be monitored in the monitor operation, the way to report the monitored result, etc. The monitor detection and selection logic 720 may also determine whether the next monitor operation is a one-shot monitor operation or a repeated monitor operation, or whether the next monitor operation is a combination of a group of monitor operations that have to be sequentially performed by multiple monitor circuits and a monitoring sequence or an activation sequence of said multiple monitor circuits when the monitor operation is a combination of a group of monitor operations. In some embodiments of the invention, the monitor detection and selection logic 720 may also determine whether to notify the calibration trigger and selection logic 730 about the triggering of the calibration operation based on the currently collected information. In the embodiments of the invention, the monitor selection control signal may carry the information regarding the results of decisions made by the monitor detection and selection logic 720 based on the currently collected information, that is, the information regarding the plurality of determinations as described above.

The monitor management logic 740 may receive the monitor selection control signal from the monitor detection and selection logic 720 and generate the corresponding monitor command to activate the corresponding monitor circuit(s) to perform the corresponding monitor operation(s). In addition, the monitor management logic 740 may also receive a monitor operation complete notification message issued by the monitor circuits through the monitor handle interface 770 and provide the information regarding completion of the monitor operation to the monitor detection and selection logic 720.

Similarly, the calibration trigger and selection logic 730 may determine content of a next calibration operation based on the currently collected information, where the content of a calibration operation may comprise the information regarding which calibration circuit is arranged to perform the calibration operation, the start time of the calibration operation and the length of execution time of the calibration operation, the target (for example, which characteristic value of which signal processing device) to be calibrated in the calibration operation, the amount of calibration (or the amount of adjustment) in the calibration operation, the way to report the calibration result, etc. The calibration trigger and selection logic 730 may also determine whether the next calibration operation is a one-shot calibration operation or a repeated calibration operation, or whether the next calibration operation is a combination of a group of calibration operations that have to be sequentially performed by multiple calibration circuits and a calibration sequence or an activation sequence when the calibration operation is a combination of a group of calibration operations that have to be sequentially performed by multiple calibration circuits. The information regarding the aforementioned determination may be collectively referred to as calibration data. In some embodiments of the invention, the calibration trigger and selection logic 730 may also determine whether to notify the monitor detection and selection logic 720 about the triggering of the monitor operation based on the currently collected information. In the embodiments of the invention, the calibration selection control signal may carry the information regarding the results of decisions made by the calibration trigger and selection logic 730 based on the currently collected information, that is, the aforementioned calibration data.

The calibration management logic 750 may receive the calibration selection control signal from the calibration trigger and selection logic 730 and generate the corresponding calibration command to activate the corresponding monitor circuit(s) to perform the corresponding calibration operation(s). In addition, the calibration management logic 750 may also receive a calibration operation complete notification message issued by the calibration circuits through the calibration handle interface 780 and provide the information regarding completion of the calibration operation to the calibration trigger and selection logic 730.

In this embodiment, the compensation control mechanism operation logic 700 may be an implementation of the compensation control mechanism operation logic 455. Therefore, regarding the descriptions of the monitor operations and calibration operations controlled by the compensation control mechanism operation logic 700, reference may be made to the descriptions regarding the compensation control mechanism operation logic 455 in the paragraphs related to FIG. 4-FIG. 6, and are not repeated here for brevity.

In addition, it is to be noted that the compensation control mechanism operation logic shown in FIG. 7 is only an embodiment of the invention, and is certainly not a limit of the invention. In another embodiment of the invention, the compensation control mechanism operation logic may also be implemented in a different way.

Figure 8:
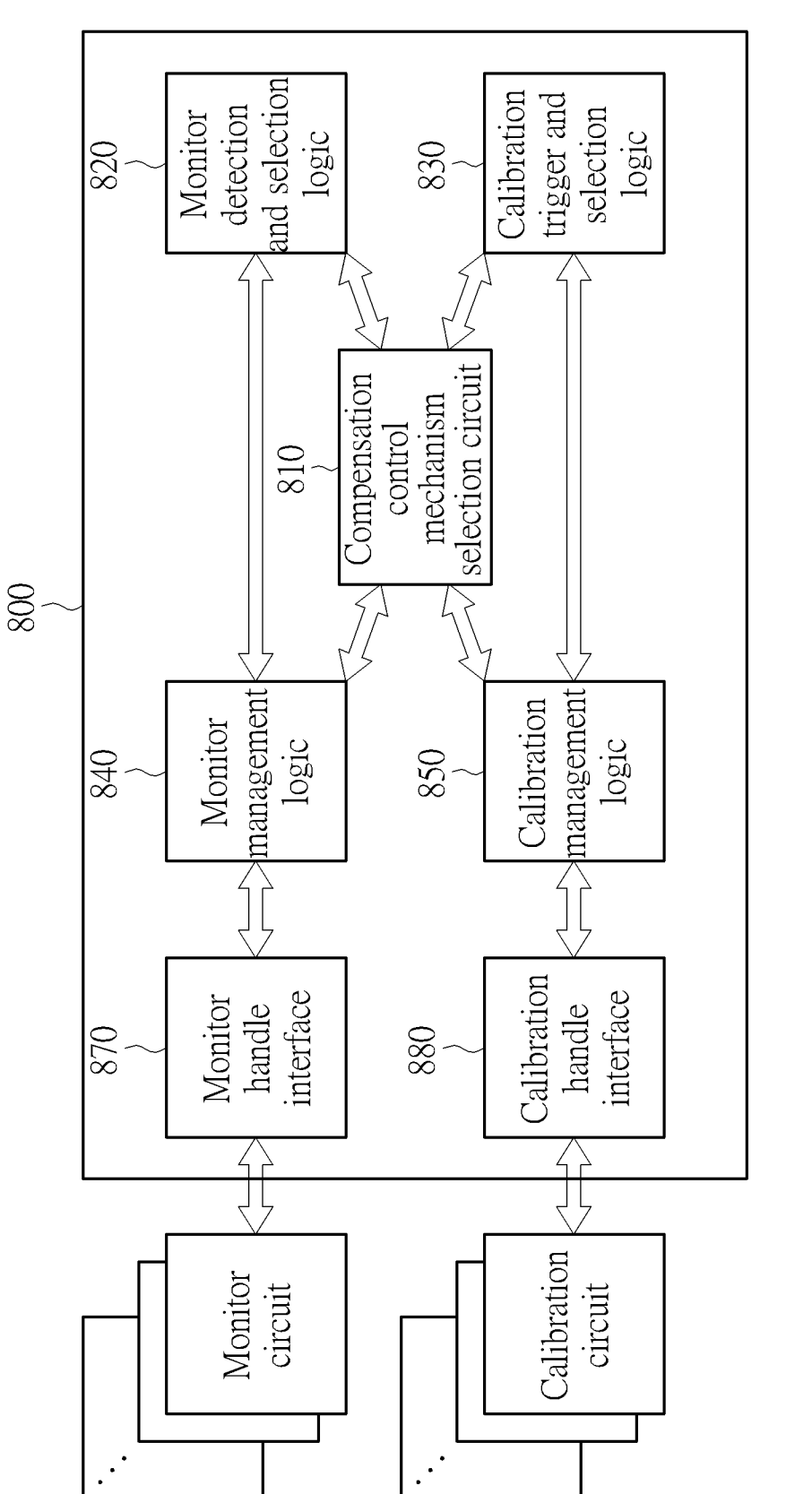
FIG. 8 is an exemplary block diagram of a compensation control mechanism operation logic according to another embodiment of the invention.

FIG. 8 is an exemplary block diagram of a compensation control mechanism operation logic according to another embodiment of the invention. The compensation control mechanism operation logic 800 may be coupled to a plurality of monitor circuits and a plurality of calibration circuits, such as the monitor circuits and calibration circuits shown in FIG. 4, to collect monitored results from the monitor circuits, determine a calibration sequence and accordingly generate calibration commands and sequentially generate a calibration control signal corresponding to each calibration circuit based on the calibration commands, so as to respectively control the corresponding calibration circuit to perform the corresponding calibration operation on at least one of the signal processing devices in response to the corresponding calibration control signal. In addition, the compensation control mechanism operation logic 800 may also collect calibration results from the calibration circuits, determine a monitoring sequence and accordingly generate monitor commands according to the calibration results and/ or the monitored results, and sequentially generate a monitor control signal corresponding to each monitor circuit based on the monitor commands, so as to respectively control the monitor circuits to perform the corresponding monitor operation on at least one of the signal processing devices in response to the corresponding monitor control signal.

The compensation control mechanism operation logic 800 may comprise a plurality of hardware circuits, such as a compensation control mechanism selection circuit 810, a monitor detection and selection logic 820, a calibration trigger and selection logic 830, a monitor management logic 840, a calibration management logic 850, a monitor handle interface 870 and a calibration handle interface 880. In an embodiment of the invention, the compensation control mechanism operation logic 800 may be a full hardware circuit, that is, each internal blocks of the compensation control mechanism operation logic 800 are all dedicated hardware circuits or logic circuits.

According to an embodiment of the invention, the compensation control mechanism selection circuit 810 may comprise a plurality of compensation control mechanism selection logics, as an example, the logic circuits to perform selection according to input data, and the compensation control mechanism selection logics are configured to select a compensation control mechanism corresponding to the calibration results and/or the monitored results based on the calibration results and/or the monitored results and set the selected compensation control mechanism as a currently-operating compensation control mechanism, so as to control at least one of the hardware circuits to operate in compliance with the currently-operating compensation control mechanism. For example, the compensation control mechanism selection circuit 810 may provide information regarding the currently-operating compensation control mechanism to one or more of the monitor detection and selection logic 820, the calibration trigger and selection logic 830, the monitor management logic 840 and the calibration management logic 850, or, the compensation control mechanism selection circuit 810 may configure the currently-operating compensation control mechanism for one or more of the monitor detection and selection logic 820, the calibration trigger and selection logic 830, the monitor management logic 840 and the calibration management logic 850 according to the selected compensation control mechanism, for those logics to operate in compliance with the currently-operating compensation control mechanism.

As an example, the compensation control mechanism selection circuit 810 may be built with the information of a plurality of compensation control mechanisms, and these compensation control mechanisms are constructed based on various calibration results and/or various monitored results. The selection logics configured in the compensation control mechanism selection circuit 810 may select the most suitable compensation control mechanism from the plurality of built-in compensation control mechanisms according to the currently obtained calibration results and/or monitored results, and set the selected compensation control mechanism to as a currently-operating compensation control mechanism, for the hardware circuits in the compensation control mechanism operation logic 800 to operate based on the currently selected compensation control mechanism.

In an embodiment of the invention, the compensation control mechanism may describe or define detailed content of at least one of the monitor operation and the calibration operation. As described above, the content of a monitor operation may comprise the information regarding which monitor circuit is arranged to perform the monitor operation, the start time of the monitor operation and the length of execution time of the monitor operation, the target (for example, a current signal or a voltage signal, the reception signal or the transmission signal, or an amplitude, a frequency or jitters of a signal, etc.) to be monitored in the monitor operation, the way to report the monitored result, etc. The content of a monitor operation may also comprise the information regarding whether the monitor operation is defined as a one-shot monitor operation or a repeated monitor operation, or a monitoring sequence or an activation sequence when the monitor operation is a combination of a group of monitor operations that have to be sequentially performed by multiple monitor circuits. In addition, the content of a calibration operation may comprise information regarding which calibration circuit is arranged to perform the calibration operation, the start time of the calibration operation and the length of execution time of the calibration operation, the target (for example, which characteristic value of which signal processing device) to be calibrated in the calibration operation, the amount of calibration (or the amount of adjustment) in the calibration operation, the way to report the calibration result, etc. The content of a calibration operation may also comprise the information regarding whether the calibration operation is defined as a one-shot calibration operation or a repeated calibration operation, or a calibration sequence or an activation sequence when the calibration operation is a combination of a group of calibration operations that have to be sequentially performed by multiple calibration circuits.

In the embodiments of the invention, the monitor detection and selection logic 820 may determine content, such as the aforementioned content, of the next monitor operation according to the currently-operating compensation control mechanism, and generate the corresponding monitor selection control signal. In addition, the monitor detection and selection logic 820 may also determine an activation sequence of the monitor circuits in the monitor and calibration procedure according to the currently-operating compensation control mechanism and/or the aforementioned content of monitor operation, and generate the corresponding monitor selection control signal. In some embodiments of the invention, the monitor detection and selection logic 820 may also determine whether to notify the calibration trigger and selection logic 830 about the triggering of the calibration operation based on the currently-operating compensation control mechanism and the currently collected information. In the embodiments of the invention, the monitor selection control signal may carry the information regarding the results of decisions made by the monitor detection and selection logic 820 based on the currently-operating compensation control mechanism, that is, the information regarding the plurality of determinations related to the monitor operations as described above.

Similarly, the calibration trigger and selection logic 830 may determine content, such as the aforementioned content, of the next calibration operation according to the currently-operating compensation control mechanism, and generate the corresponding calibration selection control signal. In addition, the calibration trigger and selection logic 830 may also determine an activation sequence of the calibration circuits in the monitor and calibration procedure according to the currently-operating compensation control mechanism and/or the aforementioned content of calibration operation, and generate the corresponding calibration selection control signal. In some embodiments of the invention, the calibration trigger and selection logic 830 may also determine whether to notify the monitor detection and selection logic 820 about the triggering of the monitor operation based on the currently-operating compensation control mechanism and the currently collected information. The information regarding the aforementioned determination may be collectively referred to as calibration data. In the embodiments of the invention, the calibration selection control signal may carry the information regarding the results of decisions made by the calibration trigger and selection logic 830 based on the currently-operating compensation control mechanism, that is, the calibration data as described above.

The monitor management logic 840 is coupled to the monitor handle interface 870 and configured to manage the monitor circuits through the monitor handle interface 870, buffer the monitored results collected from the monitor circuits and generate the monitor command according to the monitor selection control signal received from the monitor detection and selection logic 820, to activate at least one of the monitor circuits corresponding to the monitor command to perform the corresponding monitor operation.

The calibration management logic 850 is coupled to the calibration handle interface 880 and configured to manage the calibration circuits through the calibration handle interface 880, buffer a plurality of calibration results collected from the calibration circuits and generate the calibration command according to the calibration selection control signal received from the calibration trigger and selection logic 830, to activate at least one of the calibration circuits corresponding to the calibration command to perform the corresponding calibration operation.

The monitor handle interface 870 is coupled to the monitor circuits and configured to receive a monitor command from the monitor management logic 840 and decode the monitor command to obtain the information regarding which monitor circuit is the one that has to perform the current monitor operation, generate a monitor control signal according to the decoding result of the monitor command, and provide the monitor control signal to the corresponding monitor circuit. The calibration handle interface 880 is coupled to the calibration circuits and configured to receive a calibration command from the calibration management logic 850 and decode the calibration command to obtain the information regarding which calibration circuit is the one that has to perform the current calibration operation, generate a calibration control signal according to a decoding result of the calibration command, and transmit the calibration control signal to the corresponding calibration circuit.

In this embodiment, the compensation control mechanism operation logic 800 may be an implementation of the compensation control mechanism operation logic 455. Therefore, regarding the descriptions of the monitor operations and calibration operations controlled by the compensation control mechanism operation logic 800, reference may be made to the descriptions regarding the compensation control mechanism operation logic 455 in the paragraphs related to FIG. 4-FIG. 6, and are not repeated here for brevity.

Different from the calibration operation that is triggered in response to the occurrence of an error in the conventional arts, in the embodiments of the invention, the monitor circuits may be utilized to actively and keep measuring and monitoring the signal processing devices in the interface circuit, and whether to perform calibration, the calibration data and the calibration method (such as the calibration data and calibration method as introduced in the paragraphs related to FIG. 4 and FIG. 6) may be determined according to the monitored results and based on the compensation control mechanism, and the calibration circuits may be utilized to calibrate the characteristic values of the signal processing devices. In this manner, drift in current, voltage and/or frequency may be compensated in real-time and occurrence of the fatal error is avoided.

In addition, in the embodiments of the invention, selection of the compensation control mechanism may be dynamically adjusted according to the latest calibration results and/or the monitored results. By dynamically adjusting the compensation control mechanism utilized in the monitor and calibration procedure, the characteristic value of the signal processing devices can be calibrated more precisely and the operation performance of the interface circuit and/or the signal processing circuit can be effectively improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An interface circuit, comprising:
   a signal processing circuit, configured to process a reception signal received from a host device and a transmission signal to be transmitted to the host device, wherein the signal processing circuit comprises:
   a plurality of signal processing devices; and
   a monitor and calibration module, comprising:
   a plurality of monitor circuits, configured to monitor at least one of an amplitude, a frequency, and a jitter in at least one of the reception signal and the transmission signal to generate a first monitored result corresponding to the at least one of the amplitude, the frequency, and the jitter in the at least one of the reception signal and the transmission signal and to monitor at least one of a power supplying voltage and a ground voltage to generate a second monitored result corresponding to the at least one of the power supplying voltage and the ground voltage in a monitor and calibration procedure;
   a plurality of calibration circuits, coupled to the plurality of signal processing devices and respectively configured to perform a calibration operation on at least one of the plurality of signal processing devices in the monitor and calibration procedure to adjust a characteristic value of the at least one of the plurality of signal processing devices; and
   a compensation control mechanism operation logic, coupled to the monitor circuits and the calibration circuits and configured to collect the first monitored result and the second monitored result from the plurality of monitor circuits and sequentially generate a calibration control signal corresponding to each calibration circuit based on the first monitored result and the second monitored result to respectively control a corresponding calibration circuit to perform the calibration operation on the at least one of the plurality of signal processing devices in response to the calibration control signal, wherein the compensation control mechanism operation logic is implemented by a Field Programmable Gate Array (FPGA) and comprises:

a calibration handle interface, coupled to the plurality of calibration circuits and configured to receive and decode a calibration command and generate the calibration control signal according to a decoding result of the calibration command, and transmit the calibration control signal to at least one of the plurality of calibration circuits.

2. The interface circuit of claim 1, wherein the interface circuit is configured inside of a memory controller and the signal processing circuit is a Serializer-Deserializer (SerDes).

3. The interface circuit of claim 1, wherein the compensation control mechanism operation logic further comprises:

a monitor handle interface, coupled to the plurality of monitor circuits and configured to receive and decode a monitor command to generate a monitor control signal according to a decoding result of the monitor command, and provide the monitor control signal to at least one of the plurality of monitor circuits.

4. The interface circuit of claim 3, wherein the compensation control mechanism operation logic further comprises:

a monitor management logic, coupled to the monitor handle interface and configured to manage the plurality of monitor circuits through the monitor handle interface, buffer the first monitored result and the second monitored result collected from the plurality of monitor circuits and generate the monitor command according to a monitor selection control signal to activate the at least one of the plurality of monitor circuits corresponding to the monitor command to perform a monitor operation.

5. The interface circuit of claim 4, wherein the compensation control mechanism operation logic further comprises:

a monitor detection and selection logic, coupled to the monitor management logic and configured to determine an activation sequence of the plurality of monitor circuits in the monitor and calibration procedure according to currently collected information, and correspondingly generate the monitor selection control signal.

6. The interface circuit of claim 5, wherein the compensation control mechanism operation logic further comprises:

a calibration management logic, coupled to the calibration handle interface and configured to manage the plurality of calibration circuits through the calibration handle interface, buffer a plurality of calibration results collected from the plurality of calibration circuits and generate the calibration command according to a calibration selection control signal to activate the at least one of the plurality of calibration circuits corresponding to the calibration command to perform the calibration operation.

7. The interface circuit of claim 6, wherein the compensation control mechanism operation logic further comprises:

a calibration trigger and selection logic, coupled to the calibration management logic and configured to determine an activation sequence of the plurality of calibration circuits in the monitor and calibration procedure according to currently collected information, and correspondingly generate the calibration selection control signal.

8. A memory controller, coupled to a memory device to control access operations of the memory device, comprising:

a host interface, configured to communicate with a host device and comprising a signal processing circuit to process a reception signal received from the host device and a transmission signal to be transmitted to the host device, wherein the signal processing circuit comprises:

a plurality of signal processing devices; and a monitor and calibration module, comprising:

a plurality of monitor circuits, configured to monitor at least one of an amplitude, a frequency, and a jitter in at least one of the reception signal and the transmission signal to generate a first monitored result corresponding to the at least one of the amplitude, the frequency, and the jitter in the at least one of the reception signal and the transmission signal and to monitor at least one of a power supplying voltage and a ground voltage to generate a second monitored result corresponding to the at least one of the power supplying voltage and the ground voltage in a monitor and calibration procedure;

a plurality of calibration circuits, coupled to the plurality of signal processing devices and respectively configured to perform a calibration operation on at least one of the plurality of signal processing devices in the monitor and calibration procedure to adjust a characteristic value of the at least one of the plurality of signal processing devices; and a compensation control mechanism operation logic, coupled to the plurality of monitor circuits and the plurality of calibration circuits and configured to collect the first monitored result and the second monitored result from the plurality of monitor circuits and sequentially generate a calibration control signal corresponding to each calibration circuit based on the first monitored result and the second monitored result to respectively control the corresponding calibration circuit to perform the calibration operation on the at least one of the plurality of signal processing devices in response to the calibration control signal, wherein the compensation control mechanism operation logic is implemented by a Field Programmable Gate Array (FPGA) and comprises:

a calibration handle interface, coupled to the plurality of calibration circuits and configured to receive and decode a calibration command and generate the calibration control signal according to a decoding result of the calibration command, and transmit the calibration control signal to at least one of the plurality of calibration circuits.

9. The memory controller of claim 8, wherein the signal processing circuit is a Serializer-Deserializer (SerDes).

10. The memory controller of claim 8, wherein the compensation control mechanism operation logic further comprises:

a monitor handle interface, coupled to the plurality of monitor circuits and configured to receive and decode a monitor command to generate a monitor control signal according to a decoding result of the monitor command, and provide the monitor control signal to at least one of the plurality of monitor circuits.

11. The memory controller of claim 10, wherein the compensation control mechanism operation logic further comprises:

a monitor management logic, coupled to the monitor handle interface and configured to manage the plurality of monitor circuits through the monitor handle interface, buffer the first monitored result and the second monitored result collected from the plurality of monitor circuits and generate the monitor command according to a monitor selection control signal to activate the at least one of the plurality of monitor circuits corresponding to the monitor command to perform a monitor operation.

12. The memory controller of claim 11, wherein the compensation control mechanism operation logic comprises:

a monitor detection and selection logic, coupled to the monitor management logic and configured to determine an activation sequence of the plurality of monitor circuits in the monitor and calibration procedure according to currently collected information, and correspondingly generate the monitor selection control signal.

13. The memory controller of claim 12, wherein the compensation control mechanism operation logic comprises:

a calibration management logic, coupled to the calibration handle interface and configured to manage the plurality of calibration circuits through the calibration handle interface, buffer a plurality of calibration results collected from the plurality of calibration circuits and generate the calibration command according to a calibration selection control signal to activate the at least one of the plurality of calibration circuits corresponding to the calibration command to perform the calibration operation.

14. The memory controller of claim 13, wherein the compensation control mechanism operation logic comprises:

a calibration trigger and selection logic, coupled to the calibration management logic and configured to determine an activation sequence of the plurality of calibration circuits in the monitor and calibration procedure according to currently collected information, and correspondingly generate the calibration selection control signal.

* * * * *